(12) United States Patent
Shimizu et al.

(10) Patent No.: US 9,786,410 B2
(45) Date of Patent: *Oct. 10, 2017

(54) TRANSPARENT CONDUCTIVE FILM, HEATER, TOUCH PANEL, SOLAR BATTERY, ORGANIC EL DEVICE, LIQUID CRYSTAL DEVICE, AND ELECTRONIC PAPER

(75) Inventors: Keisuke Shimizu, Kanagawa (JP); Toshiyuki Kobayashi, Kanagawa (JP); Nozomi Kimura, Kanagawa (JP); Kyoko Izuha, Kanagawa (JP)

(73) Assignee: Sony Corporation, Tokyo (JP)

( * ) Notice: Subject to any disclaimer, the term of this patent is extended or adjusted under 35 U.S.C. 154(b) by 644 days.

This patent is subject to a terminal disclaimer.

(21) Appl. No.: 14/005,976

(22) PCT Filed: Mar. 21, 2012

(86) PCT No.: PCT/JP2012/057137
§ 371 (c)(1),
(2), (4) Date: Sep. 18, 2013

(87) PCT Pub. No.: WO2012/133029
PCT Pub. Date: Oct. 4, 2012

(65) Prior Publication Data
US 2014/0017444 A1    Jan. 16, 2014

(30) Foreign Application Priority Data

Mar. 28, 2011 (JP) ................................. 2011-070355
Jan. 19, 2012 (JP) ................................. 2012-009460

(51) Int. Cl.
*B32B 3/24* (2006.01)
*H01B 5/00* (2006.01)
(Continued)

(52) U.S. Cl.
CPC ......... *H01B 5/00* (2013.01); *B29D 11/00788* (2013.01); *B82Y 30/00* (2013.01);
(Continued)

(58) Field of Classification Search
CPC ....................................................... H01B 5/00
See application file for complete search history.

(56) References Cited

U.S. PATENT DOCUMENTS

| | | | |
|---|---|---|---|
| 2010/0028681 A1* | 2/2010 | Dai | B82Y 30/00 428/408 |
| 2011/0201201 A1* | 8/2011 | Arnold | B82Y 30/00 438/694 |
| 2012/0249829 A1* | 10/2012 | Izuha | H01L 27/14621 348/229.1 |

FOREIGN PATENT DOCUMENTS

| | | |
|---|---|---|
| JP | 02-126314 A | 5/1990 |
| JP | 10-326152 A | 12/1998 |

(Continued)

OTHER PUBLICATIONS

Kim et al., Enhancing the conductivity of transparent grapheme films via doping. Nanotechnol. 2010;21:285205. 6 pages.

*Primary Examiner* — William P Watkins, III
(74) *Attorney, Agent, or Firm* — Chip Law Group

(57) ABSTRACT

There are provided a transparent conductive film, as well as a heater, a touch panel, a solar battery, an organic EL device, a liquid crystal device, and an electronic paper that are provided with the transparent conductive film, the transparent conductive film being capable of easing a decline in optical transmittance when graphene is laminated, and of achieving optical transmittance higher than an upper limit of optical transmittance of a single layer of graphene. The transparent conductive film includes a single-layered conductive graphene sheet. The single-layered conductive graphene sheet includes a first region and a second region, the
(Continued)

first region being configured of graphene, and the second region being surrounded by the first region and having optical transmittance that is higher than optical transmittance of the first region.

18 Claims, 21 Drawing Sheets

(51) Int. Cl.
| | |
|---|---|
| G02F 1/1343 | (2006.01) |
| H05B 3/14 | (2006.01) |
| H01L 51/44 | (2006.01) |
| H01L 31/0224 | (2006.01) |
| G06F 3/044 | (2006.01) |
| G06F 3/045 | (2006.01) |
| H01L 51/52 | (2006.01) |
| H05B 3/06 | (2006.01) |
| C01B 31/04 | (2006.01) |
| B82Y 30/00 | (2011.01) |
| B82Y 40/00 | (2011.01) |
| B29D 11/00 | (2006.01) |
| G02F 1/167 | (2006.01) |
| H01M 14/00 | (2006.01) |
| G02F 1/1333 | (2006.01) |

(52) U.S. Cl.
CPC .......... *B82Y 40/00* (2013.01); *C01B 31/0453* (2013.01); *G02F 1/13439* (2013.01); *G06F 3/044* (2013.01); *G06F 3/045* (2013.01); *H01L 31/022425* (2013.01); *H01L 31/022466* (2013.01); *H01L 51/442* (2013.01); *H01L 51/5209* (2013.01); *H01L 51/5215* (2013.01); *H01L 51/5234* (2013.01); *H05B 3/06* (2013.01); *H05B 3/145* (2013.01); *C01B 2204/02* (2013.01); *G02B 2207/121* (2013.01); *G02F 1/13338* (2013.01); *G02F 1/133382* (2013.01); *G02F 2001/1676* (2013.01); *G02F 2201/121* (2013.01); *G02F 2202/16* (2013.01); *G02F 2203/01* (2013.01); *G06F 2203/04103* (2013.01); *H01M 14/005* (2013.01); *H05B 2214/04* (2013.01); *Y02E 10/549* (2013.01); *Y10T 428/24273* (2015.01); *Y10T 428/24479* (2015.01); *Y10T 428/24802* (2015.01)

(56) References Cited

FOREIGN PATENT DOCUMENTS

| | | |
|---|---|---|
| JP | 2006-521634 A | 9/2006 |
| JP | 2009-107921 A | 5/2009 |
| JP | 2009-110496 A | 5/2009 |

* cited by examiner

[ FIG. 1 ]
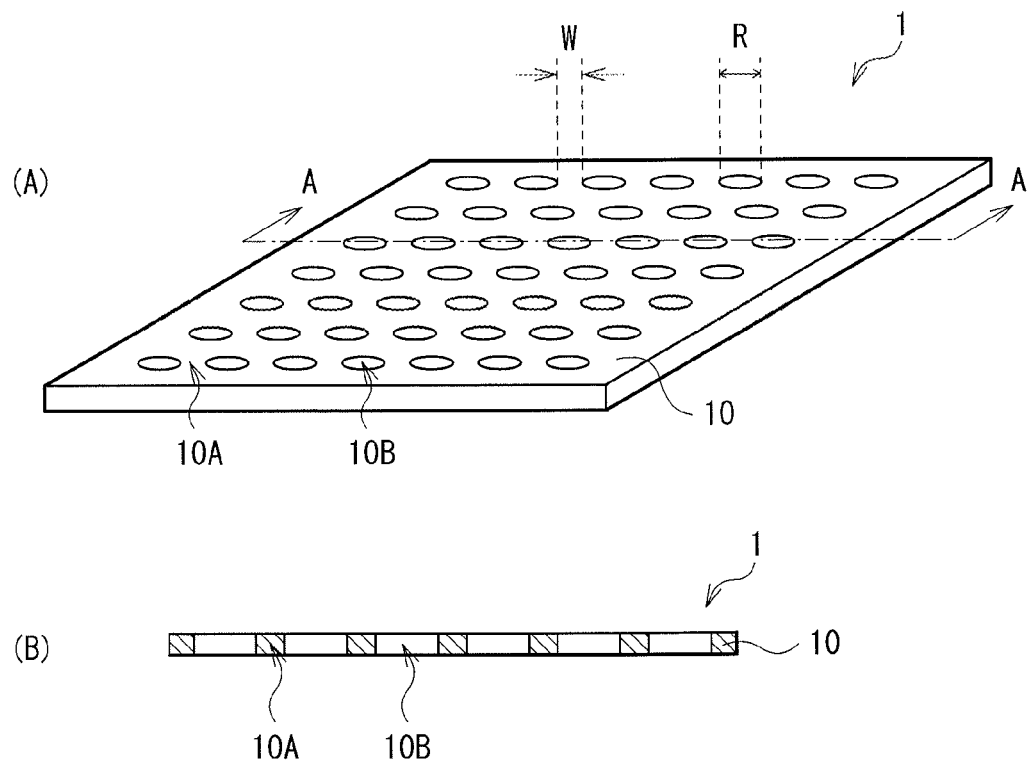
[ FIG. 2 ]
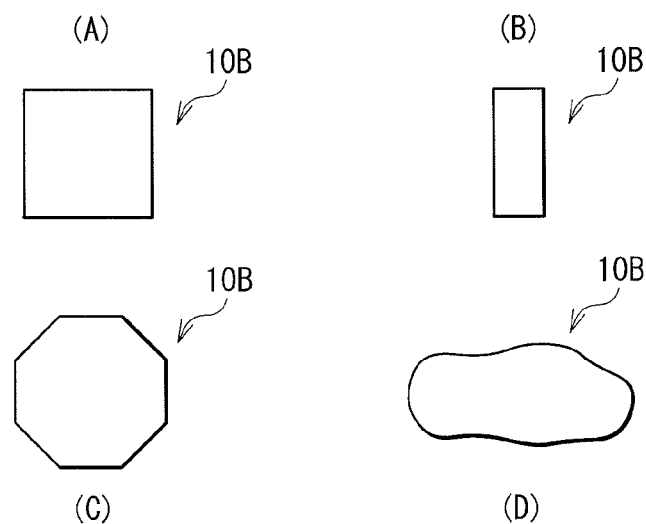

[FIG. 3]
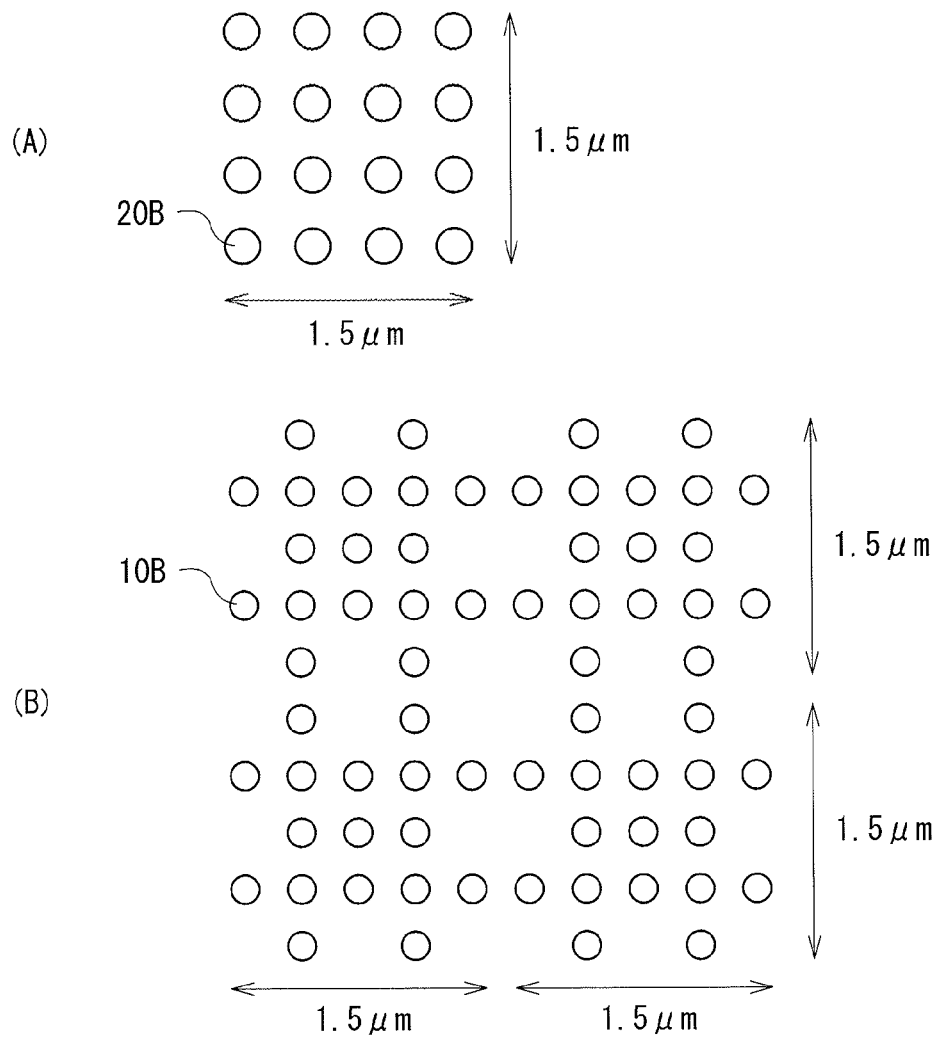
[FIG. 4]
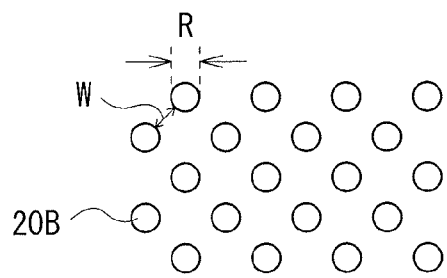

[ FIG. 5 ]

| TRANSMITTANCE (%) | | WIDTH OF NARROWEST PART OF FIRST REGION 10A | | | | | |
|---|---|---|---|---|---|---|---|
| | | 20nm | 50nm | 100nm | 200nm | 500nm | 1000nm |
| DIAMETER R OF SECOND REGION 10B | 50nm | 98.8 | 98.2 | 97.9 | 97.8 | 97.7 | 97.7 |
| | 100nm | 99.1 | 98.6 | 98.2 | 97.9 | 97.8 | 97.7 |
| | 200nm | 99.4 | 99.0 | 98.6 | 98.2 | 97.9 | 97.8 |
| | 500nm | 99.6 | 99.4 | 99.1 | 98.8 | 98.2 | 97.9 |
| | 1000nm | 99.7 | 99.6 | 99.4 | 99.1 | 98.6 | 98.2 |

[ FIG. 6 ]

| TRANSMITTANCE (%) | | WIDTH OF NARROWEST PART OF FIRST REGION 10A | | | | |
|---|---|---|---|---|---|---|
| | | 50nm | 100nm | 200nm | 500nm | 1000nm |
| DIAMETER R OF SECOND REGION 10B | 50nm | 98.3 | 98.0 | 97.8 | 97.7 | 97.7 |
| | 100nm | 98.7 | 98.3 | 98.0 | 97.8 | 97.7 |
| | 200nm | 99.2 | 98.7 | 98.3 | 98.0 | 97.8 |
| | 500nm | 99.6 | 99.3 | 98.9 | 98.3 | 98.0 |
| | 1000nm | 99.8 | 99.6 | 99.3 | 98.7 | 98.3 |

[ FIG. 7 ]

| SHEET RESISTANCE (Ω/□) | | WIDTH OF NARROWEST PART OF FIRST REGION 10A | | | | | |
|---|---|---|---|---|---|---|---|
| | | 20nm | 50nm | 100nm | 200nm | 500nm | 1000nm |
| DIAMETER R OF SECOND REGION 10B | 50nm | 280 | 160 | 120 | 100 | 88 | 84 |
| | 100nm | 480 | 240 | 160 | 120 | 96 | 88 |
| | 200nm | 880 | 400 | 240 | 160 | 112 | 96 |
| | 500nm | 2080 | 880 | 480 | 280 | 160 | 120 |
| | 1000nm | 4080 | 1680 | 880 | 480 | 240 | 160 |

[ FIG. 8 ]

| SHEET RESISTANCE (Ω/□) | | WIDTH OF NARROWEST PART OF FIRST REGION 10A | | | | |
|---|---|---|---|---|---|---|
| | | 50nm | 100nm | 200nm | 500nm | 1000nm |
| DIAMETER R OF SECOND REGION 10B | 50nm | 160 | 120 | 100 | 88 | 84 |
| | 100nm | 240 | 160 | 120 | 96 | 88 |
| | 200nm | 400 | 240 | 160 | 112 | 96 |
| | 500nm | 880 | 480 | 280 | 160 | 120 |
| | 1000nm | 1680 | 880 | 480 | 240 | 160 |

[ FIG. 9 ]

| COVERAGE (%) | TRANSMITTANCE (%) | SHEET RESISTANCE (Ω/□) |
|---|---|---|
| 100 | 97.7 | 80 |
| 99 | 97.7 | 103 |
| 90 | 97.9 | 117 |
| 80 | 98.2 | 122 |
| 70 | 98.4 | 145 |
| 60 | 98.6 | 217 |
| 50 | 98.9 | 274 |
| 40 | 99.1 | 356 |
| 30 | 99.3 | 492 |
| 20 | 99.5 | 760 |
| 10 | 99.8 | 1560 |
| 5 | 99.9 | 3160 |
| 0 | 100.0 | ∞ |

[ FIG. 10 ]
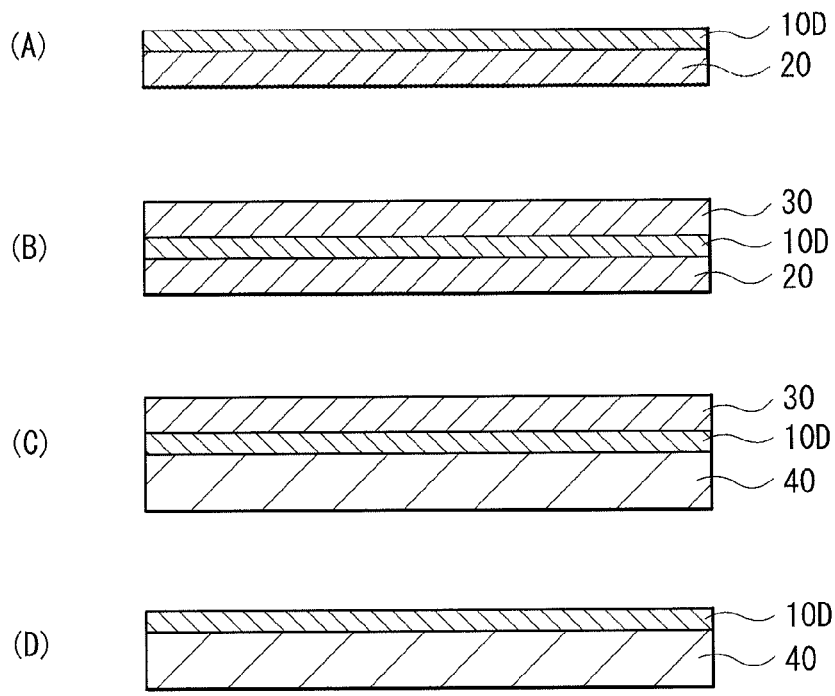
[ FIG. 11 ]
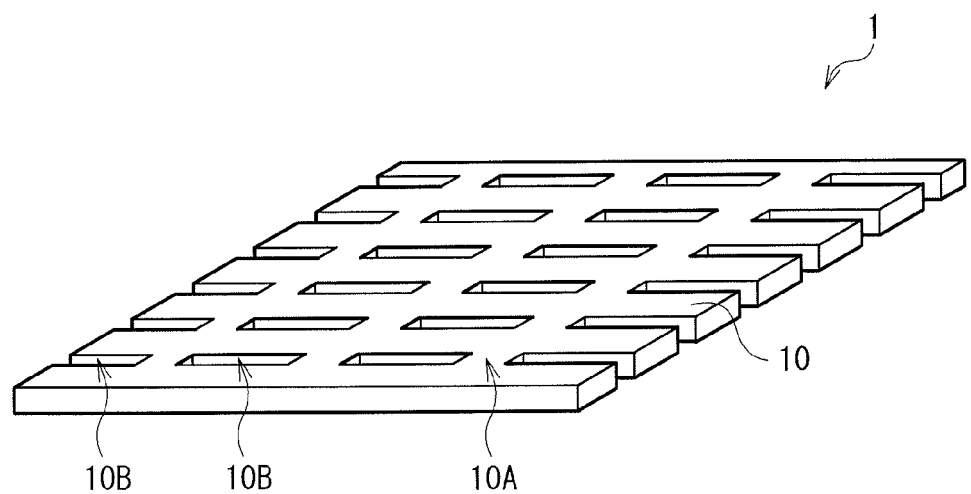

[ FIG. 12 ]
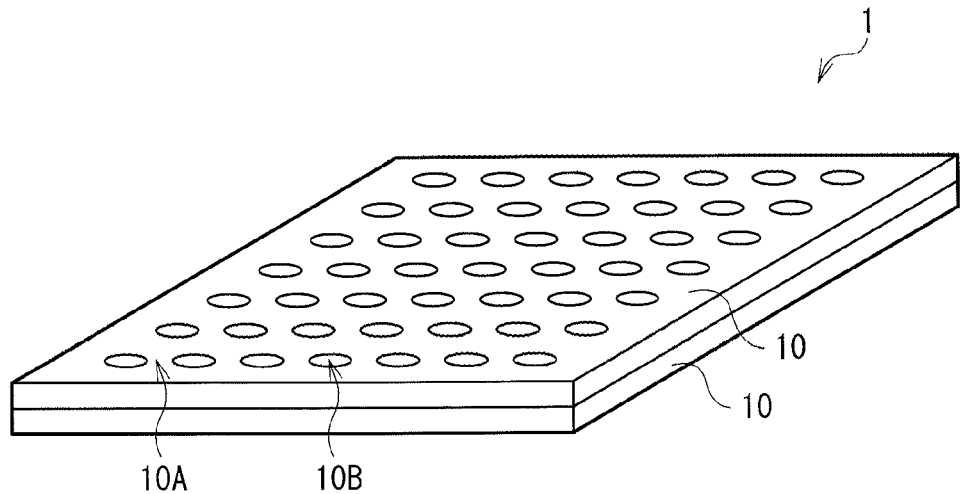
[ FIG. 13 ]
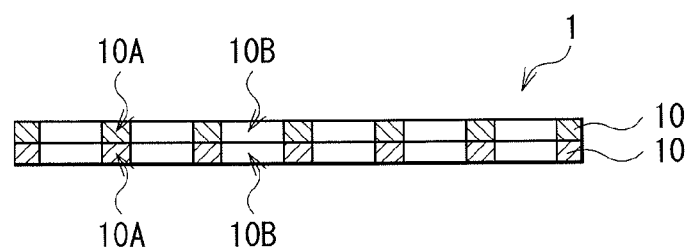
[ FIG. 14 ]
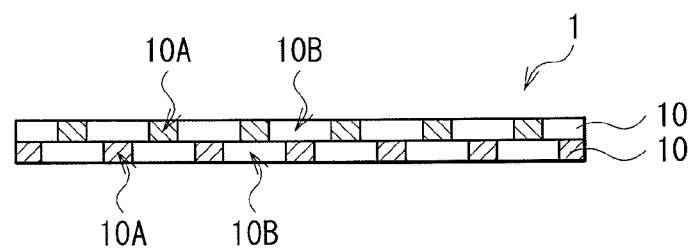
[ FIG. 15 ]
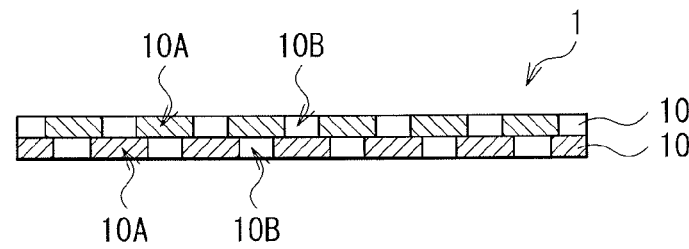

[ FIG. 16 ]
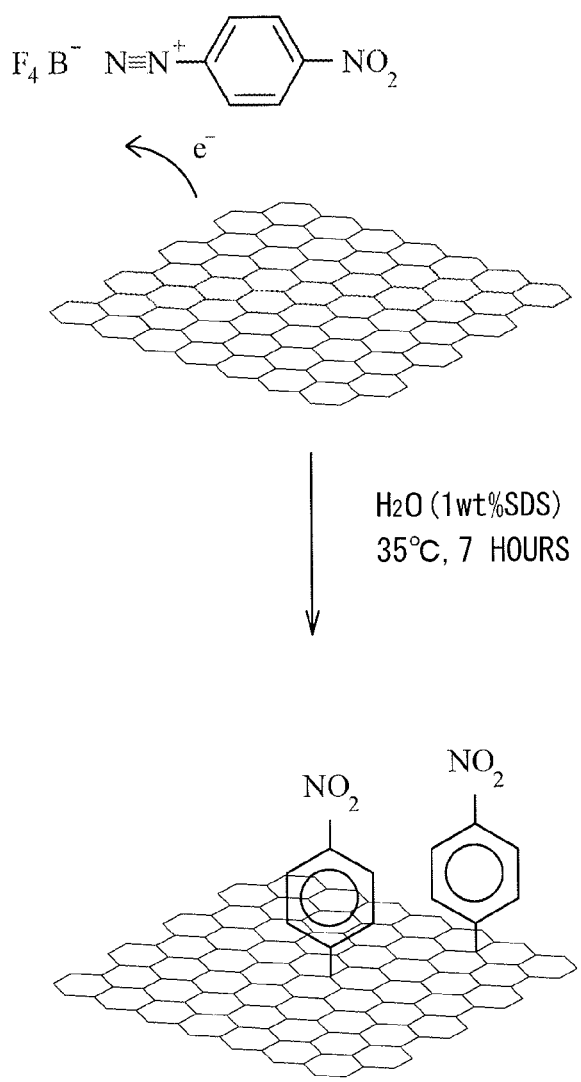

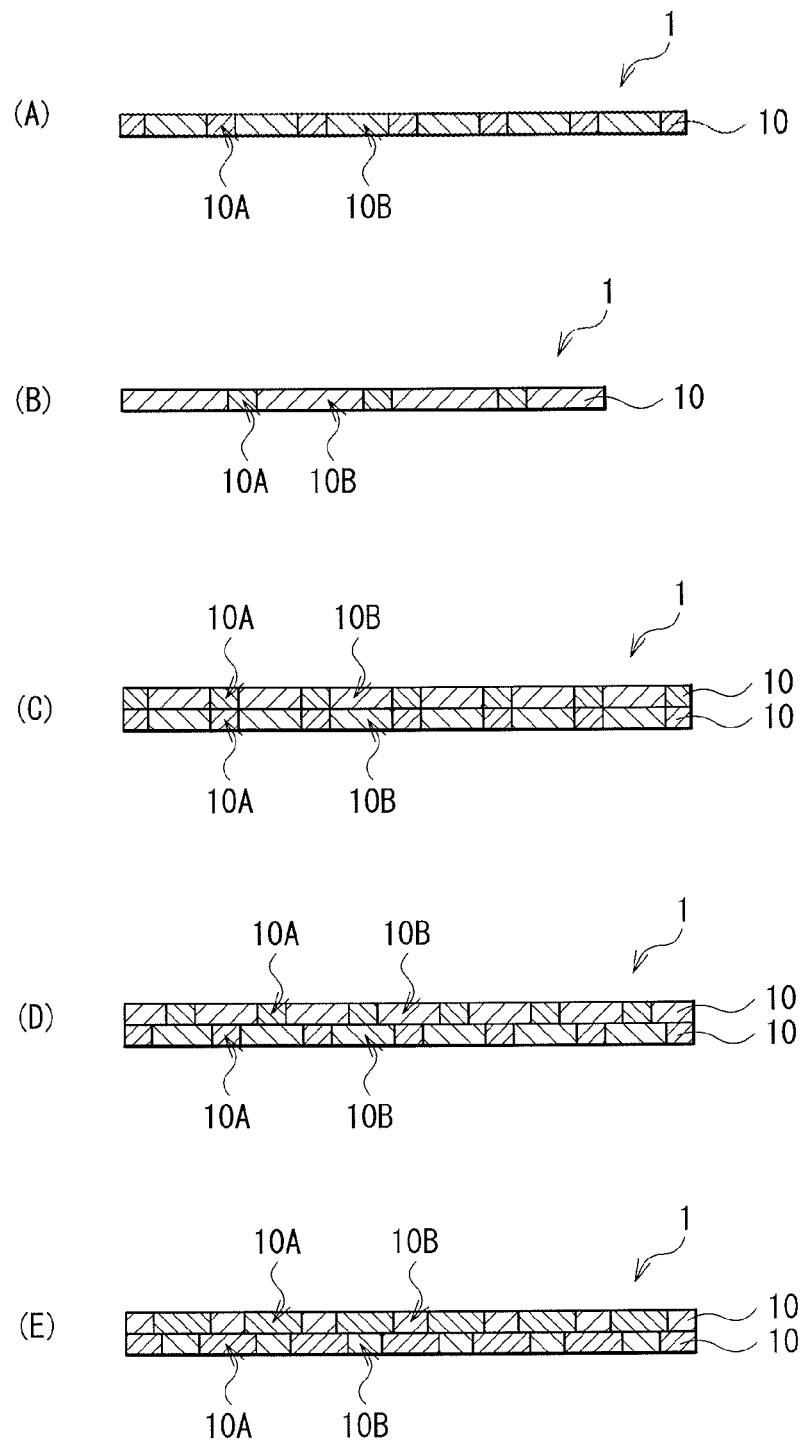
[ FIG. 17 ]

[ FIG. 18 ]
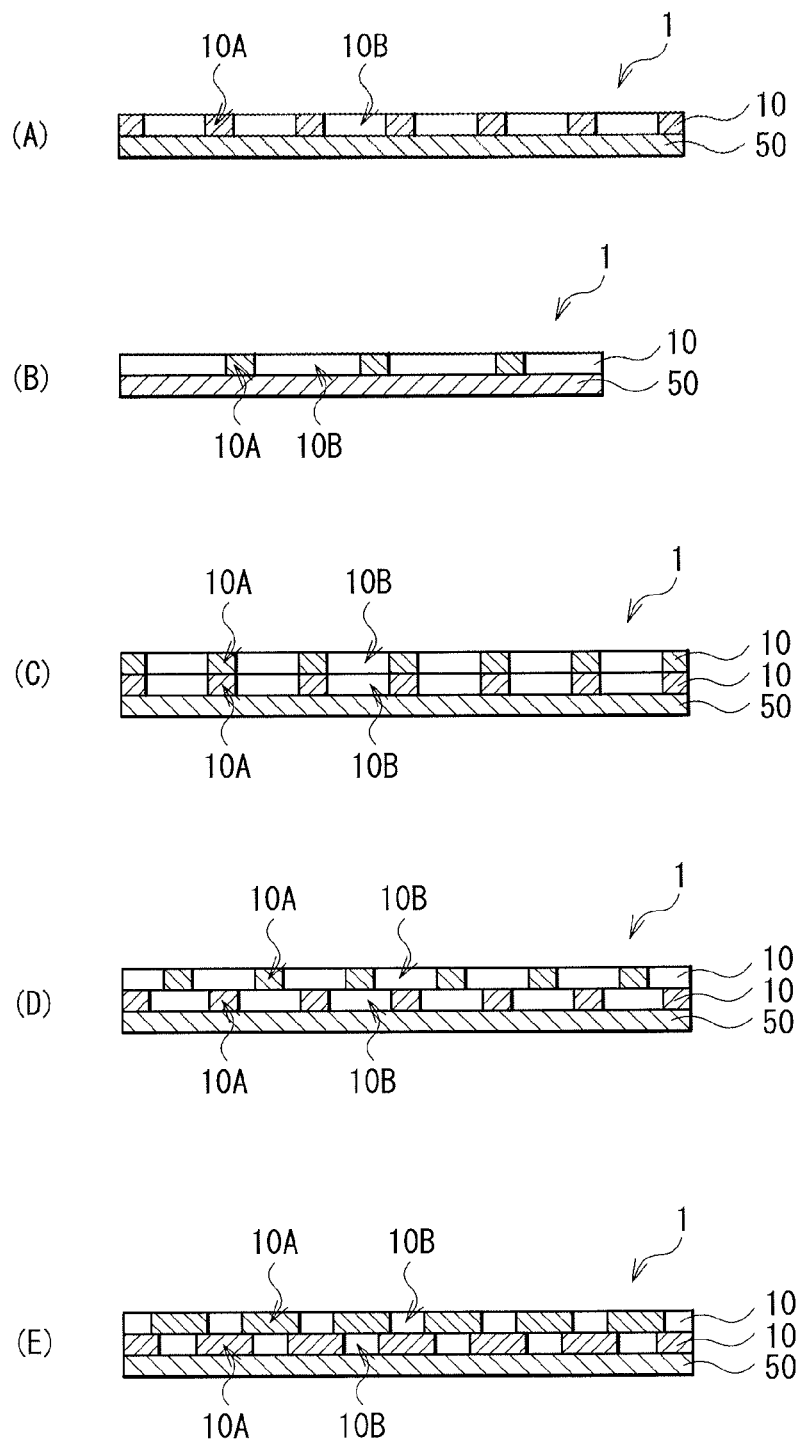

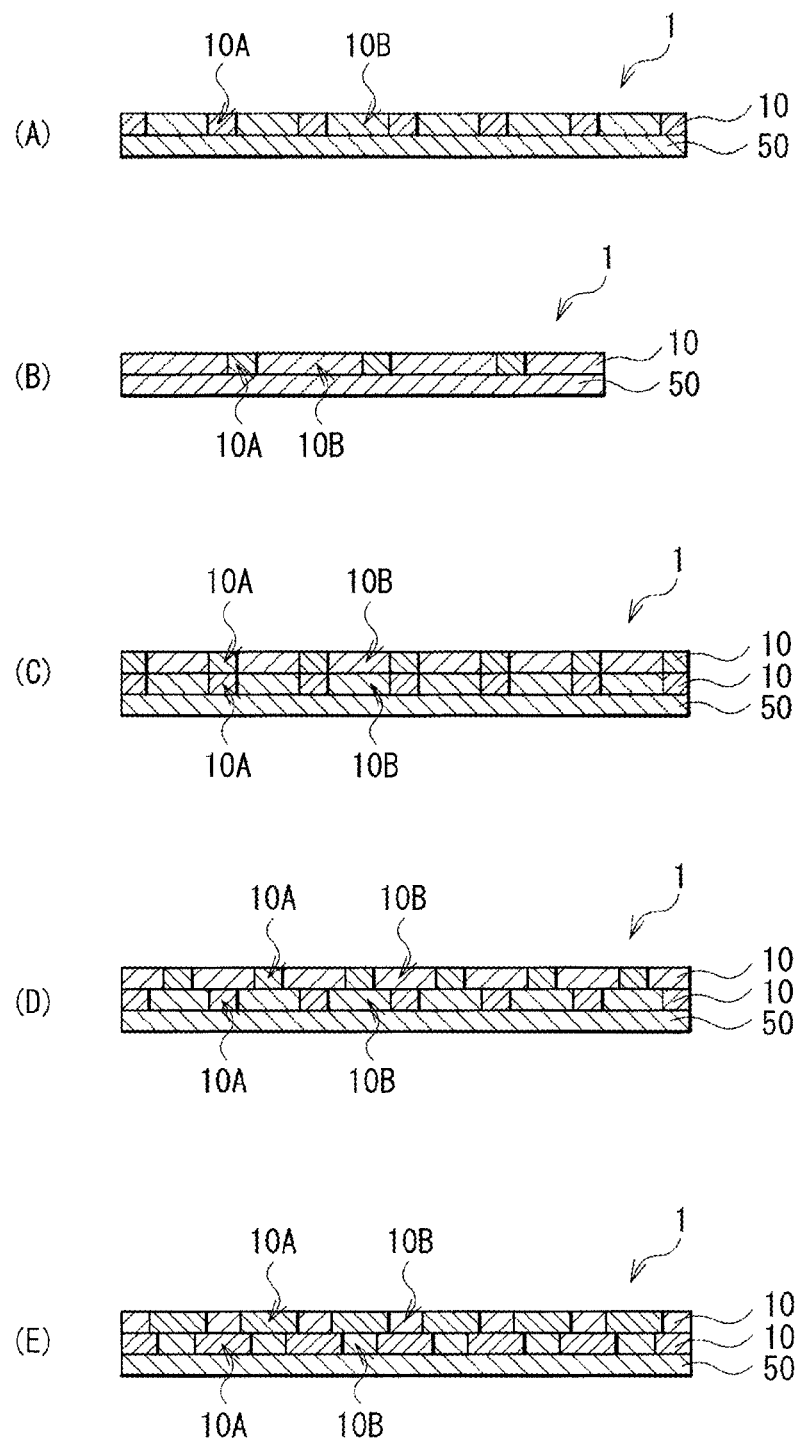
[FIG. 19]

[ FIG. 20 ]
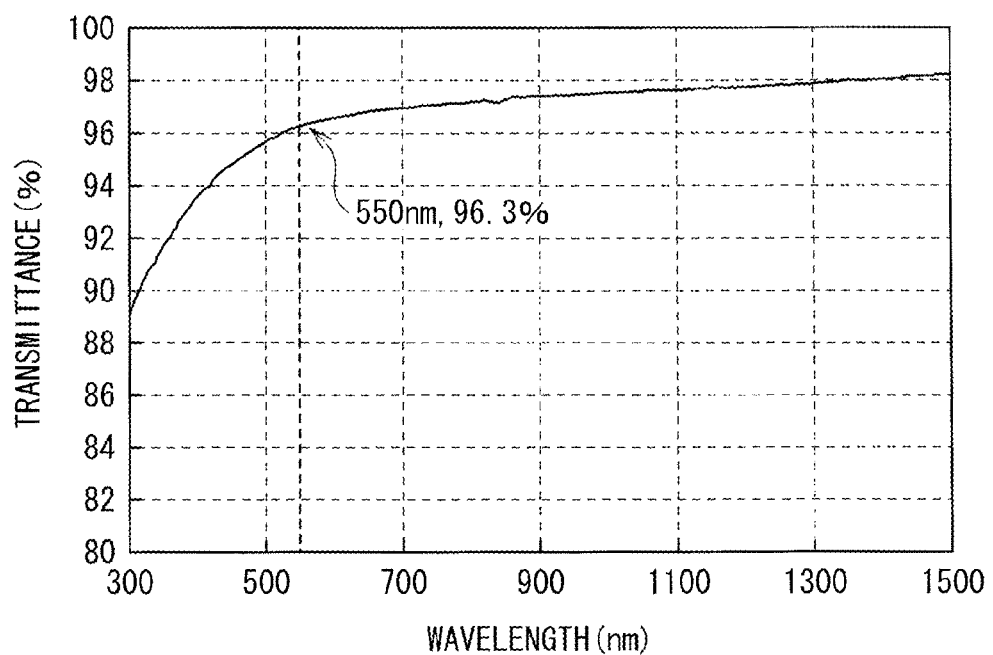

[ FIG. 21 ]
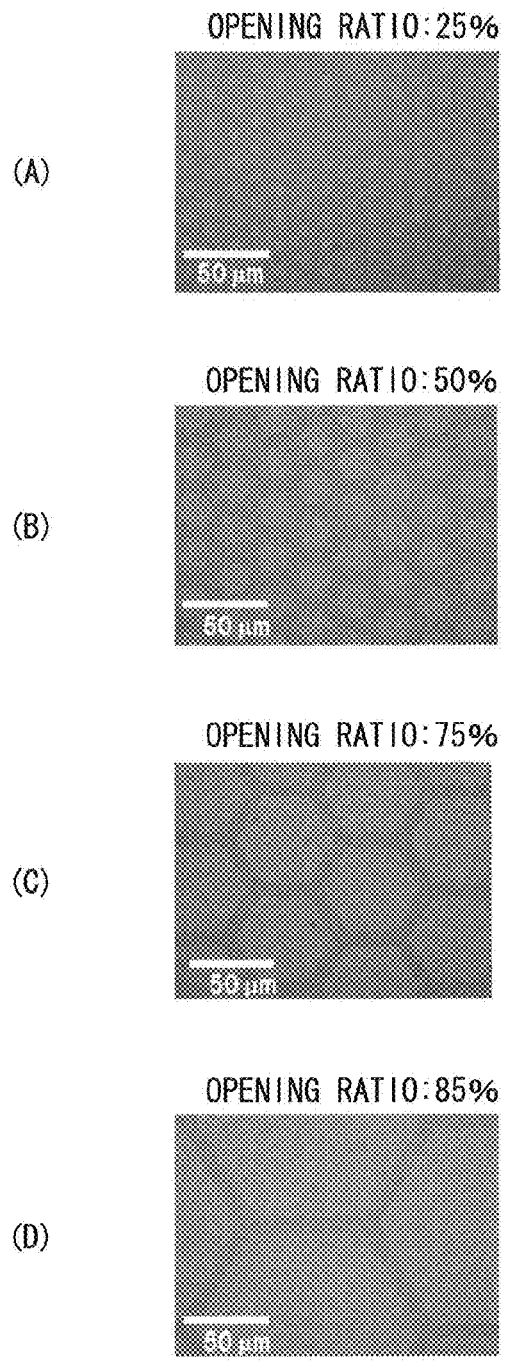

[ FIG. 22 ]
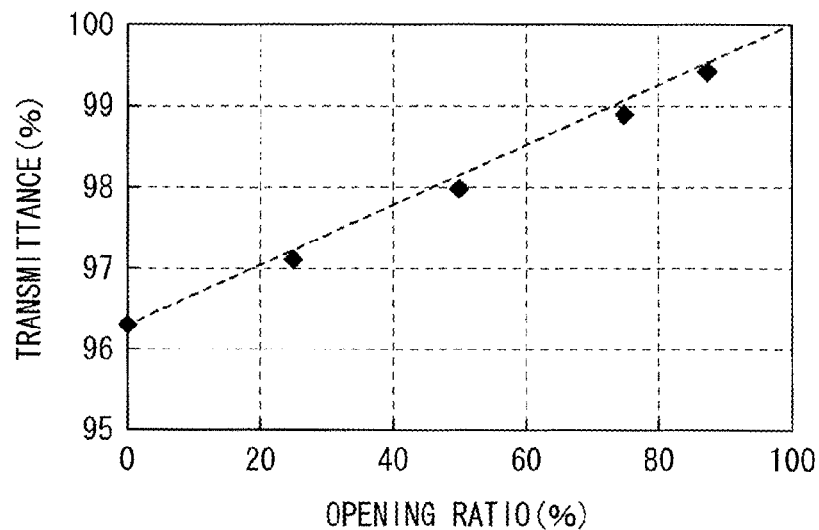
[ FIG. 23 ]
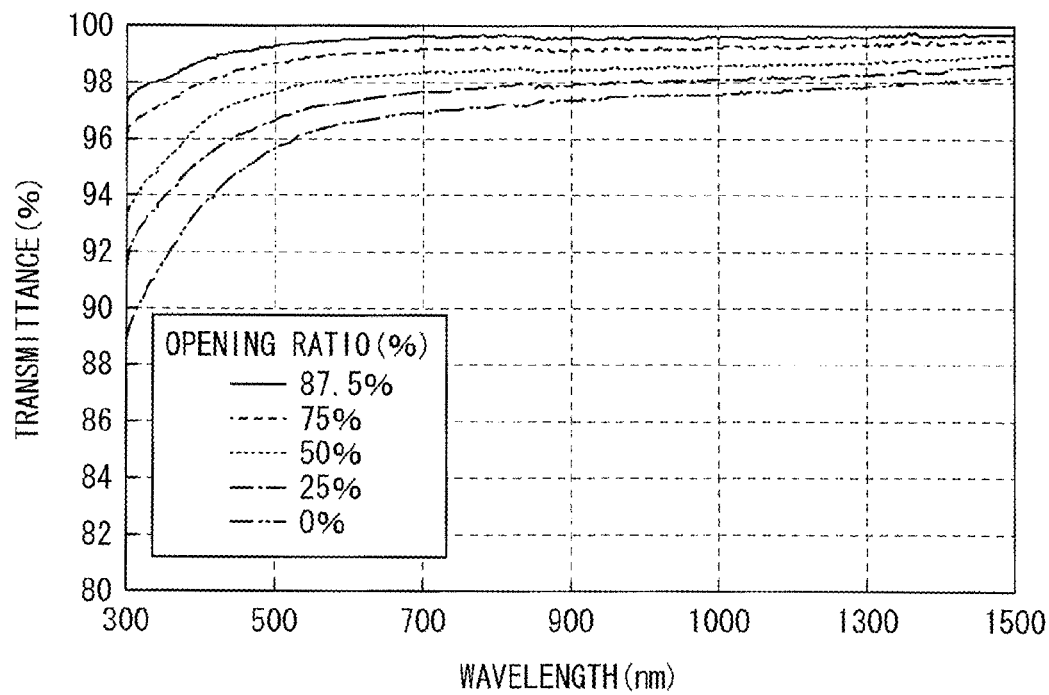

[ FIG. 24 ]
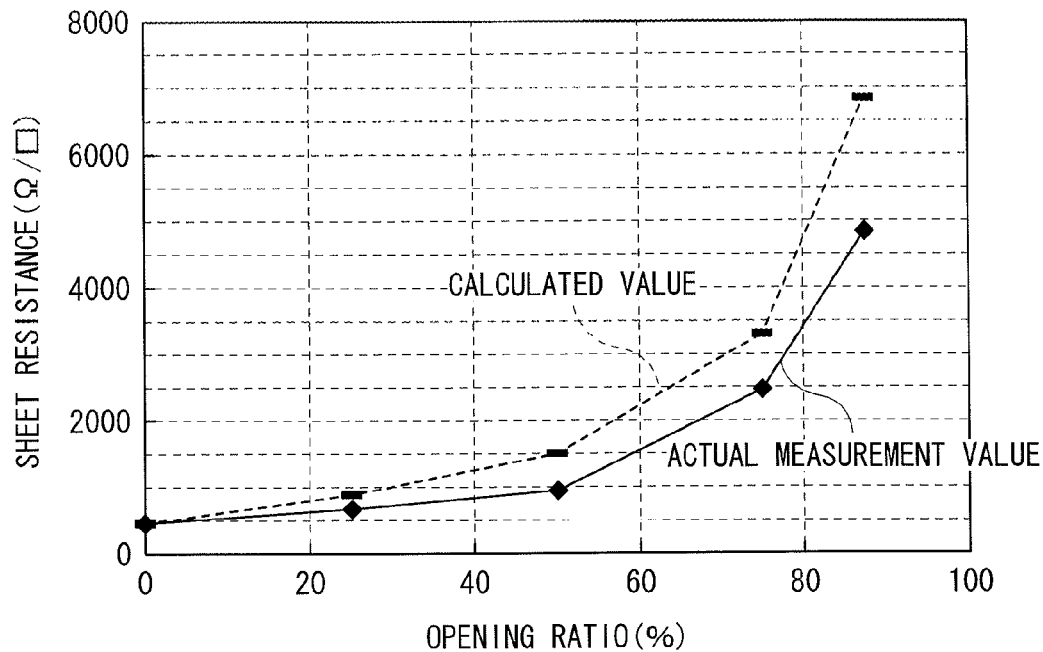
[ FIG. 25 ]
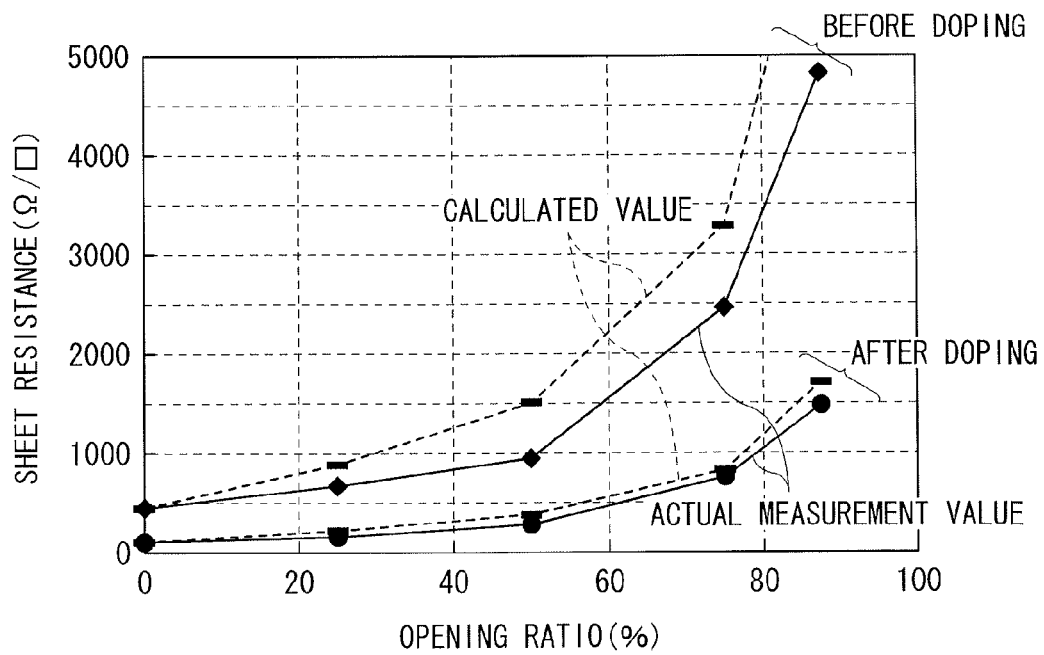

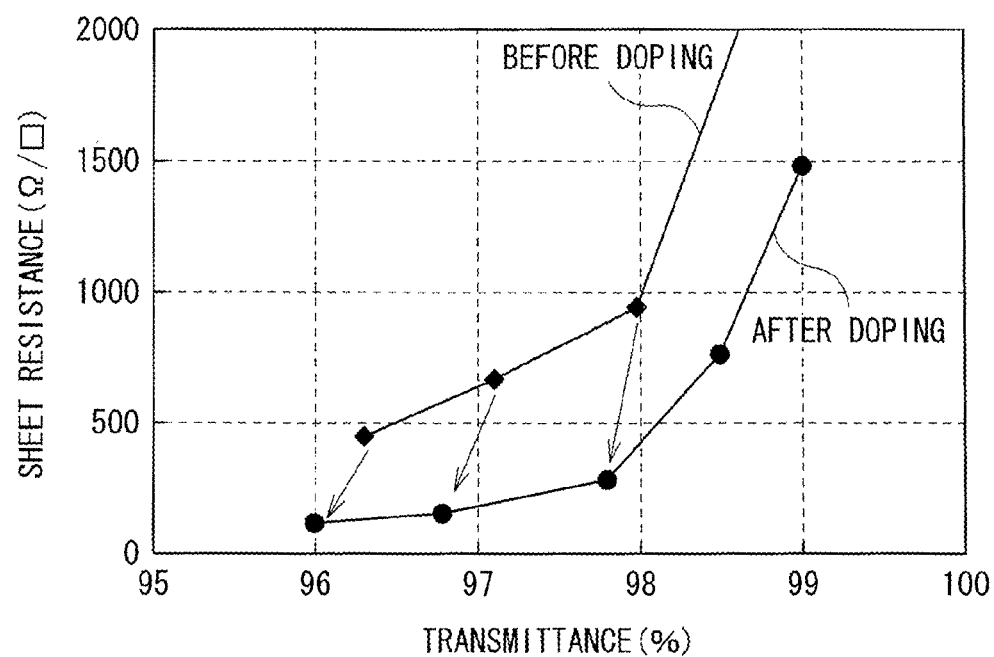
[ FIG. 26 ]

[ FIG. 27 ]
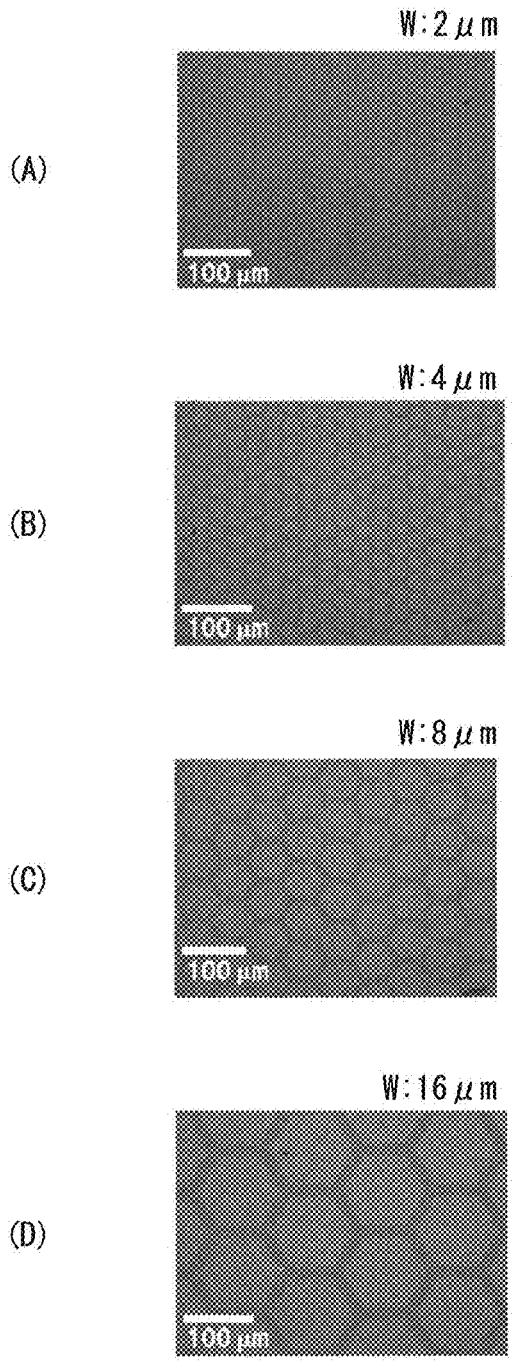

[ FIG. 28 ]
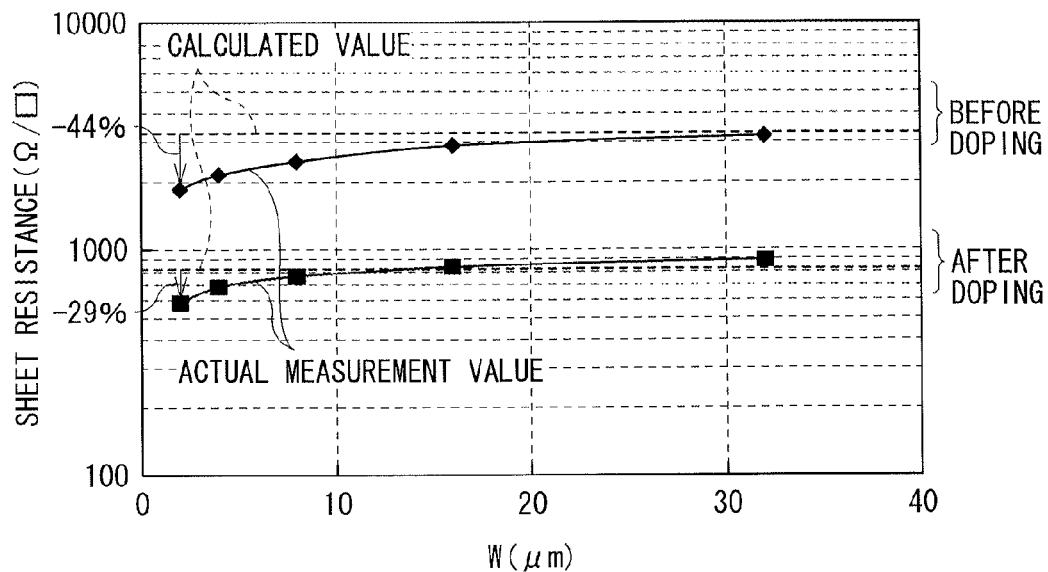
[ FIG. 29 ]
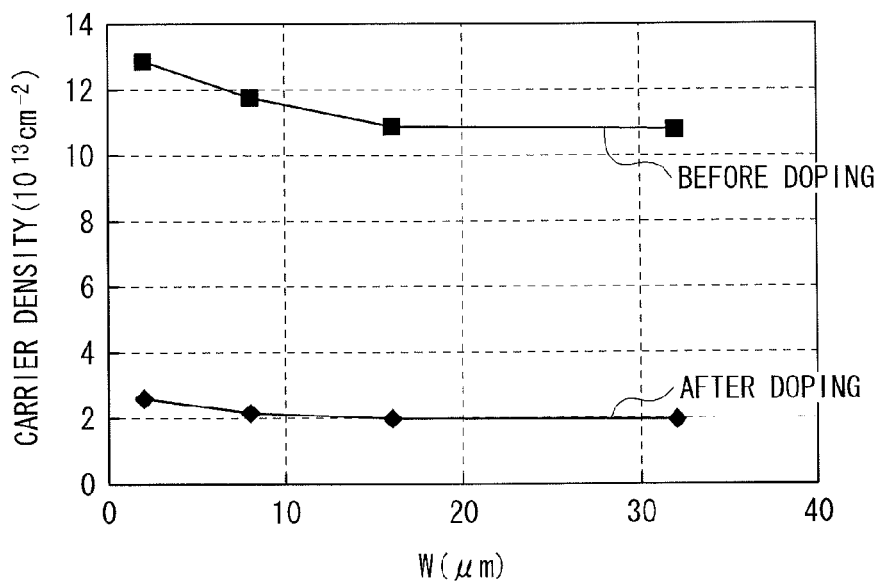

[ FIG. 30 ]
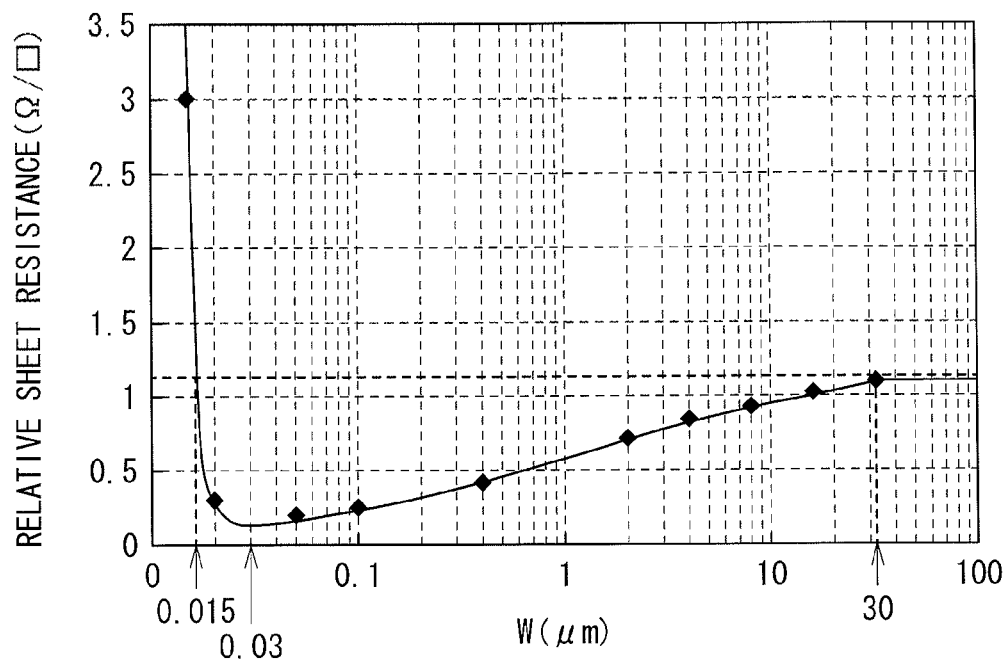
[ FIG. 31 ]
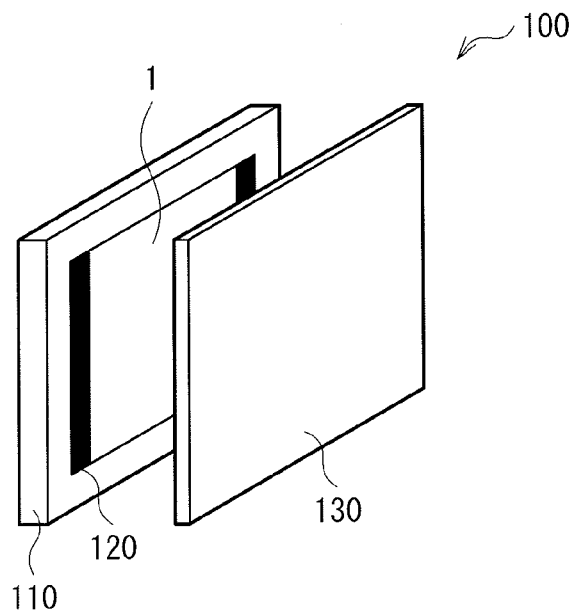

[ FIG. 32 ]
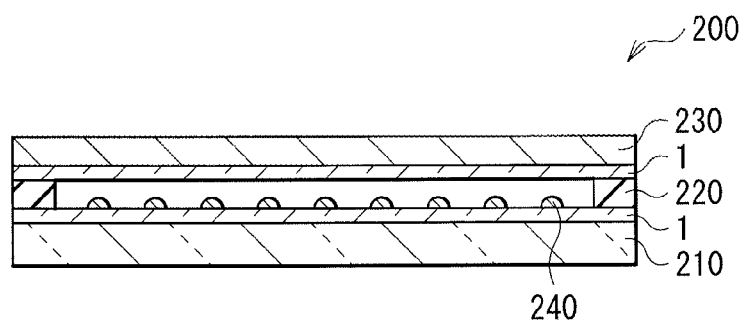
[ FIG. 33 ]
(A)
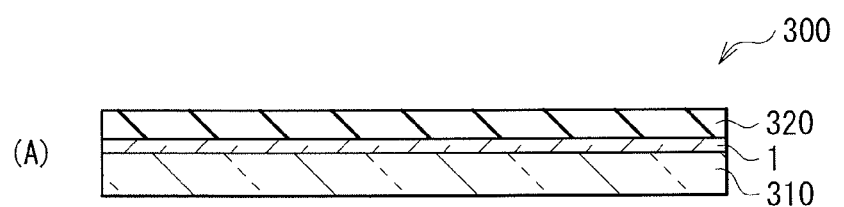
(B)
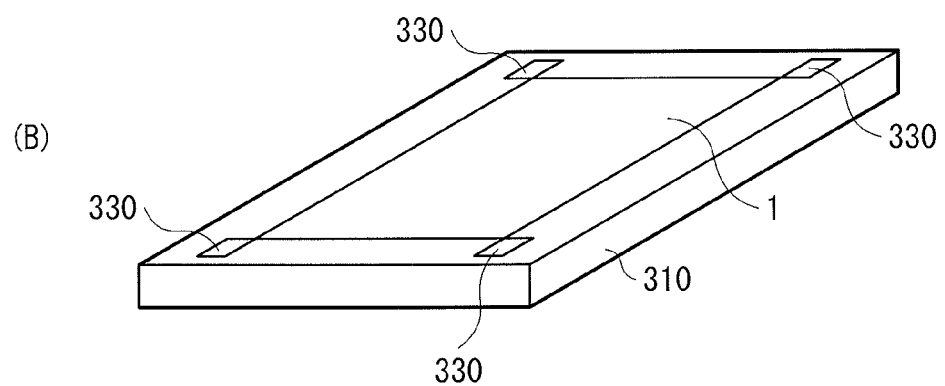

[ FIG. 34 ]
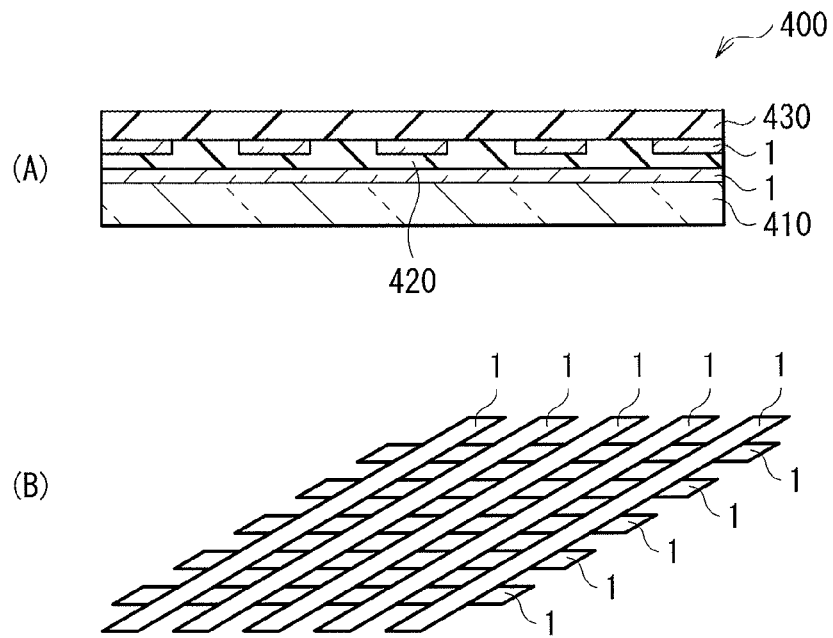
[ FIG. 35 ]
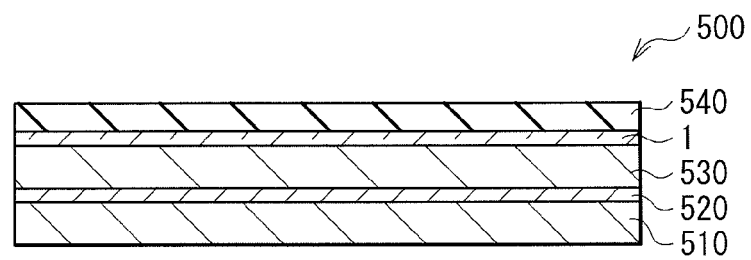
[ FIG. 36 ]
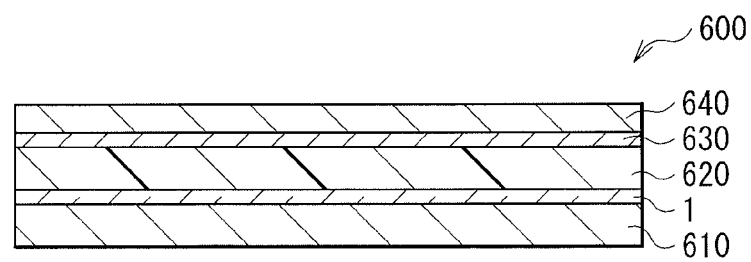

[ FIG. 37 ]
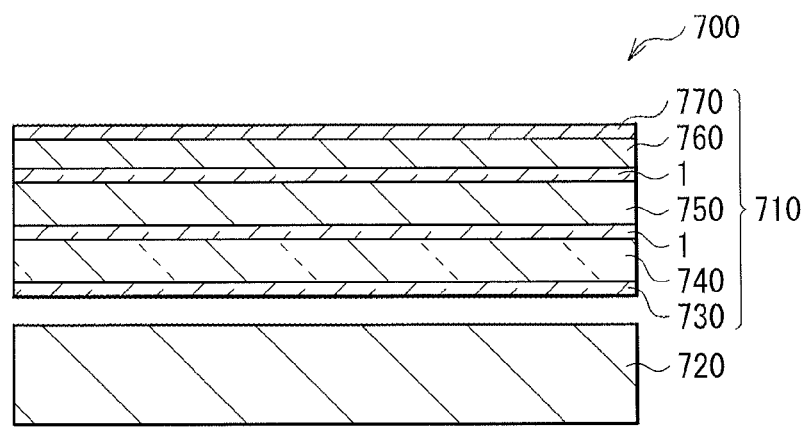
[ FIG. 38 ]
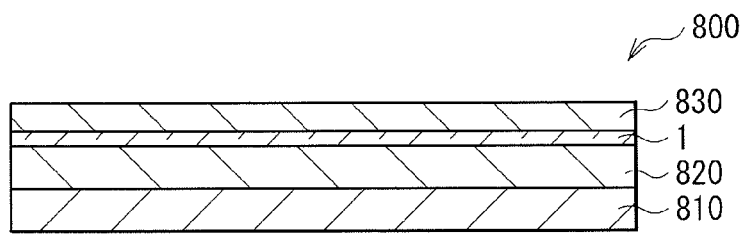

TRANSPARENT CONDUCTIVE FILM, HEATER, TOUCH PANEL, SOLAR BATTERY, ORGANIC EL DEVICE, LIQUID CRYSTAL DEVICE, AND ELECTRONIC PAPER

CROSS REFERENCES TO RELATED APPLICATIONS

The present application is the national stage of International Application No. PCT/JP2012/057137, filed on Mar. 21, 2012, which claims the benefit under 35 U.S.C. §119 of Japanese Patent Application 2011-070355, filed on Mar. 28, 2011, and Japanese Patent Application 2012-009460, filed on Jan. 19, 2012.

TECHNICAL FIELD

The present technology relates to a transparent conductive film formed by laminating one or a plurality of graphenes, as well as a heater, a touch panel, a solar battery, an organic electroluminescence (EL) device, a liquid crystal device, and an electronic paper that are provided with the transparent conductive film.

BACKGROUND ART

A transparent conductive film is used for various devices such as a touch panel, a solar battery, an electronic paper, and an image sensor. Materials generally used as a transparent conductive film include indium tin oxide (ITO). An ITO film is a conductive material having extremely high optical transmittance. However, in recent years, depending on application, conductivity equivalent to that of the ITO film and optical transmittance higher than that of the ITO film, or optical transmittance equivalent to that of the ITO film and conductivity higher than that of the ITO film have been demanded.

Materials attracting attention lately as alternatives to ITO include graphene. When a covalent bond between carbon atoms occurs due to a sp2 hybrid orbital, a network structure film in which six-membered rings (a five-membered ring or a seven-membered ring may be included in some cases) are spread all over a planer surface. This network structure film of carbon atoms is called graphene, and what is formed by laminating a large number of (typically, some hundreds of) graphenes is called graphite.

Graphene is obtained by, for example, affixing a Scotch tape (Scotch is a registered trademark of 3M) to graphite; exfoliating graphene by using adhesive strength of the tape; and transferring the graphene to a silicon wafer in which an $SiO_2$ film is formed on a surface. Recently, graphene has been formed using CVD (Chemical Vapor Deposition), and graphene having excellent properties has been obtained (see Patent Literature 1).

CITATION LIST

Patent Literature

[Patent Literature 1] Japanese Unexamined Patent Application Publication No. 2009-107921

SUMMARY OF THE INVENTION

Incidentally, a lower limit of sheet resistance in a single layer of graphene is usually about 80 ohm/square. Meanwhile, an upper limit of optical transmittance in a single layer of graphene is usually about 97.7%. Here, for example, suppose that a person skilled in the art is considering laminating graphene, trying to make the sheet resistance smaller than 80 ohm/square. When graphene is laminated, however, the optical transmittance becomes much lower than the upper limit value of the optical transmittance in the single layer of graphene. For example, when two layers of graphene are laminated, the optical transmittance sharply drops to about 95%. Further, suppose that a person skilled in the art is considering reducing the number of lamination layers of graphene, trying to increase the optical transmittance. However, even when the number of lamination layers of graphene is reduced to one that is a lower limit, the optical transmittance is incapable of exceeding 97.7%.

Therefore, it is desirable to provide a transparent conductive film capable of easing a decline in optical transmittance when graphene is laminated, and obtaining optical transmittance higher than the upper limit of optical transmittance in a single layer of graphene, as well as a heater, a touch panel, a solar battery, an organic EL device, a liquid crystal device, and an electronic paper which are provided with the transparent conductive film.

A transparent conductive film one of an embodiment of the present technology includes a single-layered first conductive graphene sheet. The first conductive graphene sheet includes a first region and a second region, the first region being configured of graphene, and the second region being surrounded by the first region and having optical transmittance that is higher than optical transmittance of the first region. In the transparent conductive film according to the embodiment of the present technology, the region that has optical transmittance higher than that of the graphene is provided in the first conductive graphene sheet. The region that has the optical transmittance higher than that of the graphene is configured of, for example, one or more of cavity, graphene oxide, transparent polymer material, and inorganic material.

A heater one of an embodiment of the present technology includes the above-described transparent conductive film as a source provided for heat generation.

Each of a touch panel, a solar battery, an organic EL device, a liquid crystal device, and an electronic paper one of embodiments of the technology includes the above-described transparent conductive film as an electrode.

In an embodiment of the present technology, a width of a narrowest part of the first region may be preferably larger than 10 nanometers. In addition, in an embodiment of the present technology, when the width of the narrowest part of the first region is larger than 10 nanometers, a layout of the second region may have regularity in a region expressed by a unit in square micrometer order.

Further, in an embodiment of the present technology, the transparent conductive film may include a plurality of the first conductive graphene sheets. In this case, the second regions of the respective first conductive graphene sheets may be laid out not to face one another at least in part, or may face each other. Furthermore, in an embodiment of the present technology, the transparent conductive film may further include, besides the first conductive graphene sheet, a single-layered second conductive graphene sheet configured of graphene.

According to each of the transparent conductive film, the heater, the touch panel, the solar battery, the organic EL device, the liquid crystal device, and the electronic paper of the embodiments of the present technology, the region that has optical transmittance higher than that of the graphene is provided in the first conductive graphene sheet. Therefore, the optical transmittance of the first conductive graphene sheet included in the transparent conductive film according to the embodiment of the present technology is allowed to be higher than optical transmittance of a conductive graphene sheet that does not have a region having high optical transmittance as that in the embodiment of the present technology. Therefore, for example, when the transparent conductive film according to the embodiment of the present technology is configured of the single-layered first conductive graphene sheet, the optical transmittance is allowed to be higher than 97.7%. In addition, for example, when the transparent conductive film according to the embodiment of the technology is configured of the plurality of first conductive graphene sheets, the optical transmittance is allowed to be higher than optical transmittance of a conductive graphene sheet that does not have a region having high optical transmittance as that in the embodiment of the present technology. Therefore, for example, a decline in optical transmittance is allowed to be eased, while making sheet resistance become smaller than 80 ohm/square. Based upon the foregoing, in the embodiment of the technology, optical transmittance higher than the upper limit of optical transmittance of the single-layered graphene sheet is allowed to be achieved, and a decline in optical transmittance when a graphene sheet is laminated is allowed to be eased.

In addition, in the embodiment of the present technology, when the width of the narrowest part of the first region is larger than 10 nm, graphene is allowed to be prevented from developing properties of a semiconductor, by optimizing a manufacturing method. This allows elimination of a decline in conductivity due to development of the properties of the semiconductor in graphene.

Further, in the embodiment of the present technology, in a case where the plurality of first conductive graphene sheets are provided, when the second regions of the respective first conductive graphene sheets are laid out not to face one another, a region where the first regions of the respective first conductive graphene sheets face one another is allowed to be reduced, as compared with when the second regions of the respective first conductive graphene sheets face one another. As a result, a region where optical transmittance significantly decreases is allowed to be reduced. Furthermore, when the second regions of the respective first conductive graphene sheets are laid out not to overlap one another, a region where the first regions of the respective first conductive graphene sheets face one another is allowed to be further reduced. As a result, a region where optical transmittance significantly decreases is allowed to be further reduced.

Moreover, in the embodiment of the present technology, in a case where the plurality of first conductive graphene sheets are provided, when the second regions of the respective first conductive graphene sheets face one another, a region where optical transmittance is extremely high is allowed to be formed more widely.

BRIEF DESCRIPTION OF DRAWINGS

FIG. 1 includes a perspective diagram and a cross-sectional diagram that illustrate an example of a transparent conductive film according to an embodiment.

FIG. 2 is a schematic diagram illustrating examples of a shape of a second region in FIG. 1.

FIG. 3 is a schematic diagram illustrating examples of a layout of the second region in FIG. 1.

FIG. 4 is a schematic diagram illustrating another example of the layout of the second region in FIG. 1.

FIG. 5 is a diagram illustrating an example of transmittance when a width of a narrowest part of graphene and an opening diameter in the transparent conductive film of FIG. 1 are varied.

FIG. 6 is a diagram illustrating another example of transmittance when the width of the narrowest part of the graphene and an opening diameter in the transparent conductive film of FIG. 1 are varied.

FIG. 7 is a diagram illustrating an example of sheet resistance when the width of the narrowest part of the graphene and the opening diameter in the transparent conductive film of FIG. 1 are varied.

FIG. 8 is a diagram illustrating another example of sheet resistance when the width of the narrowest part of the graphene and the opening diameter in the transparent conductive film of FIG. 1 are varied.

FIG. 9 is a diagram illustrating an example of each of transmittance and sheet resistance when coverage of graphene in the transparent conductive film of FIG. 1 is varied.

FIG. 10 is a cross-sectional diagram illustrating an example of a process of manufacturing the transparent conductive film in FIG. 1.

FIG. 11 is a perspective diagram illustrating a modification of the transparent conductive film in FIG. 1.

FIG. 12 is a perspective diagram illustrating another modification of the transparent conductive film in FIG. 1.

FIG. 13 is a cross-sectional diagram illustrating an example of the transparent conductive film in FIG. 9.

FIG. 14 is a cross-sectional diagram illustrating another example of the transparent conductive film in FIG. 9.

FIG. 15 is a cross-sectional diagram illustrating still another example of the transparent conductive film in FIG. 9.

FIG. 16 is a schematic diagram illustrating a process of doping graphene.

FIG. 17 is a cross-sectional diagram illustrating modifications of the respective transparent conductive films in Part (B) of FIG. 1 and FIG. 12 to FIG. 15.

FIG. 18 is a cross-sectional diagram illustrating other modifications of the respective transparent conductive films in Part (B) in FIG. 1 and FIG. 12 to FIG. 15.

FIG. 19 is a cross-sectional diagram illustrating modifications of the respective transparent conductive films in Parts (A) to (E) of FIG. 17.

FIG. 20 is a diagram illustrating wavelength dependence of transmittance in a transparent conductive film before opening formation.

FIG. 21 includes photographs of appearances of transparent conductive films according to Examples.

FIG. 22 is a diagram illustrating an actual measurement value of transmittance of the transparent conductive film in each of Parts (A) to (D) of FIG. 21.

FIG. 23 is a diagram illustrating a measured value of wavelength dependence of transmittance in the transparent conductive film in each of FIG. 20 and Parts (A) to (D) of FIG. 21.

FIG. 24 is a diagram illustrating a calculated value and an actual measurement value of sheet resistance of the transparent conductive film in each of FIG. 20 and Parts (A) to (D) of FIG. 21.

FIG. 25 is a diagram illustrating a calculated value and an actual measurement value in sheet resistance of the transparent conductive film in each of FIG. 20 and Parts (A) to (D) in FIG. 21, before doping and after the doping.

FIG. 26 is a diagram illustrating a calculated value and an actual measurement value in sheet resistance of the transparent conductive film in each of FIG. 20 and Parts (A) to (D) of FIG. 21, before doping and after the doping.

FIG. 27 includes photographs each showing an appearance of each transparent conductive film, when an aperture ratio is made constant (75%), and a width W of a narrowest part of a first region 10A is set to be each of 2 micrometers, 4 micrometers, 8 micrometers, and 16 micrometers.

FIG. 28 is a diagram illustrating a calculated value and an actual measurement value in sheet resistance of the transparent conductive film in each of Parts (A) to (D) of FIG. 27, before doping and after the doping.

FIG. 29 is a diagram illustrating an actual measurement value of carrier density of the transparent conductive film in each of Parts (A) to (D) of FIG. 27, before doping and after the doping.

FIG. 30 is a diagram illustrating a value (relative sheet resistance) obtained by normalizing an actual measurement value of sheet resistance by using a predetermined value, when the width W is varied.

FIG. 31 is a developed perspective view of a transparent heater according to a first application example.

FIG. 32 is a cross-sectional diagram of a touch panel according to a second application example.

FIG. 33 Part (A) of FIG. 33 is a cross-sectional diagram of a touch panel according to a third application example. Part (B) of FIG. 33 is a perspective diagram illustrating a configuration of a transparent conductive film in the touch panel of Part (A) of FIG. 33.

FIG. 34 Part (A) of FIG. 34 is a cross-sectional diagram of a touch panel according to a fourth application example. Part (B) of FIG. 34 is a perspective diagram illustrating a configuration of a transparent conductive film in the touch panel of Part (A) of FIG. 34.

FIG. 35 is a cross-sectional diagram of a solar battery according to a fifth application example.

FIG. 36 is a cross-sectional diagram of an organic EL device according to a sixth application example.

FIG. 37 is a cross-sectional diagram of a liquid crystal device according to a seventh application example.

FIG. 38 is a cross-sectional diagram of an electronic paper according to an eighth application example.

MODES FOR CARRYING OUT THE INVENTION

An embodiment of the technology will be described below in detail with reference to the drawings. It is to be noted that the description will be provided in the following order.
1. Embodiment
An example in which a transparent conductive film is made of a single-layered conductive graphene sheet (FIG. 1 to FIG. 10)
2. Modifications
An example in which a notch is provided in place of an opening (FIG. 11)
An example in which a transparent conductive film is made of a plurality of conductive graphene sheets (FIG. 12 to FIG. 15)
An example in which a conductive graphene sheet is doped (FIG. 16)
An example in which an opening is filled with some kind of light transmissive material (FIG. 17, FIG. 19)
An example in which a conductive graphene sheet having no opening is provided (FIG. 18, FIG. 19)
3. Example (FIG. 20 to FIG. 30)
4. Application examples (FIG. 31 to FIG. 38)

1. Embodiment (Configuration)

Part (A) of FIG. 1 illustrates an example of a top-surface configuration of a transparent conductive film 1 according to an embodiment. Part (B) of FIG. 1 illustrates an example of a cross-sectional configuration taken along a direction of arrows A-A in Part (A) of FIG. 1. This transparent conductive film 1 may include, for example, as illustrated in Part (B) in FIG. 1, a single-layered conductive graphene sheet 10. It is to be noted that the transparent conductive film 1 may include a highly-transparent layer, besides the conductive graphene sheet 10, and, for example, may include a glass substrate, a resin substrate, or the like supporting the conductive graphene sheet 10.

The conductive graphene sheet 10 may be configured to include, for example, as illustrated in Parts (A) and (B) of FIG. 1, a first region 10A, and a second region 10B surrounded by the first region 10A and having optical transmittance higher than that of the first region 10A.

The first region 10A is made of a single layer of graphene having conductivity. Here, "graphene" refers to a network structure film in which six-membered rings (a five-membered ring or a seven-membered ring may be included in some cases), which are formed by a covalent bond between a plurality of carbon atoms occurring due to a sp2 hybrid orbital, are spread all over a planar surface. "Having conductivity" refers to not having a band gap like that of a semiconductor, or refers to having properties like those of a semimetal having no band gap.

In order for graphene to have conductivity, it is at least necessary that a width of a narrowest part of the graphene be larger than 10 nm. When the width of the narrowest part of the graphene is 10 nm or less, the graphene easily develops properties of a semiconductor in an existing manufacturing method. However, when the width of the narrowest part of the graphene is larger than 10 nm, it is possible to prevent the graphene from developing properties of a semiconductor, by optimizing a manufacturing method. Therefore, in order for the first region 10A to have conductivity, it is necessary that a width W of a narrowest part of the first region 10A be larger than 10 nm.

Optical transmittance of a single layer of graphene is usually about 97.7%. Therefore, optical transmittance of the first region 10A is also about 97.7%. In addition, sheet resistance of a single layer of graphene is usually about 80 ohm/square. Therefore, sheet resistance of the first region 10A is also about 80 ohm/square.

The second region 10B is made of a cavity. The cavity may be, for example, made of an opening, as illustrated in Parts (A) and (B) of FIG. 1. The opening may be, for example, circular, as illustrated in Part (A) and (B) of FIG. 1. It is to be noted that the opening is not limited to being circular, and may take various shapes. The opening may be, for example, square as illustrated in Part (A) of FIG. 2, rectangular as illustrated in Part (B) of FIG. 2, or polygonal as illustrated in Part (C) of FIG. 2. The opening may be geometrical as illustrated in Parts (A) to (C) of FIG. 2, or may be indefinite or random in shape as illustrated in Part (D) of FIG. 2. In addition, the openings may be identical to one another in shape as illustrated in Part (A) and (B) of FIG. 1, or part of the openings may be different in shape from the remaining openings.

Further, a layout of the second region 10B has regularity. For example, the layout of the second region 10B may have regularity in a region expressed by a unit in square micrometer order (e.g. per 1.5 square micrometers) as illustrated in Part (A) of FIG. 3. Devices, which demand regularity in a region expressed by a unit in square micrometer order for the layout of the second region 10B when the transparent conductive film 1 is applied to the devices, include, for example, an image sensor and the like.

It is to be noted that the layout of the second region 10B may have irregularity. For example, the layout of the second region 10B may have irregularity in a region expressed by a unit in square micrometer order (e.g. per 1.5 square micrometers), as illustrated in Part (B) of FIG. 3. For example, the layout of the second region 10B may have irregularity in a region expressed by a unit in square micrometer order (e.g. per 1.5 square micrometers) as illustrated in Part (B) of FIG. 3, and may have regularity in a region per unit (e.g. per 9 square micrometers) larger than the unit of the irregularity. In addition, a whole region where the openings are provided (that is, a whole surface of the conductive graphene sheet 10) may be irregular regardless of region.

Further, when the layout of the second region 10B has regularity, the plurality of second regions 10B may be arranged, for example, in a square-grid-like state as illustrated in Parts (A) and (B) of FIG. 3, or may be arranged, for example, in a triangular-grid-like state as illustrated in FIG. 4.

A diameter R of the opening is defined by taking at least one of sheet resistance and optical transmittance of the transparent conductive film 1 into consideration. For example, when the sheet resistance of the transparent conductive film 1 is taken into consideration, the diameter R of the opening may be preferably 10 nm or larger. Further, for example, when the optical transmittance of the transparent conductive film 1 is taken into consideration, the diameter R of the opening may be preferably some hundreds of micrometers or smaller. Furthermore, for example, when both of the sheet resistance and the optical transmittance of the transparent conductive film 1 are taken into consideration, the diameter R of the opening may be preferably 10 nm or larger and some hundreds of micrometers or smaller.

FIG. 5 and FIG. 6 each illustrate an example of the transmittance of the transparent conductive film 1 when the width W of the narrowest part of the first region 10A and the diameter R of the second region 10B are varied. FIG. 7 and FIG. 8 each illustrate an example of the sheet resistance of the transparent conductive film 1 when the width W of the narrowest part of the first region 10A and the diameter R of the second region 10B are varied.

It is to be noted that FIG. 5 and FIG. 7 are results when each of the second regions 10B is circular, and the plurality of second regions 10B are arranged in a triangular-grid-like state. FIG. 6 and FIG. 8 are results when each of the second regions 10B is square, and the plurality of second regions 10B are arranged in a square-grid-like state. Further, the lower limit of the width W of the narrowest part of the first region 10A is 20 nm in FIG. 5 and FIG. 7, and 50 nm in FIG. 6 and FIG. 8, but as described above, the actual lower limit of the width W of the narrowest part of the first region 10A is 10 nm. Furthermore, in FIG. 5 to FIG. 8, the lower limit of the diameter R of the second region 10B is 50 nm, but as described above, the actual lower limit of the diameter R of the second region 10B is 10 nm.

It can be seen from FIG. 5 and FIG. 6 that the smaller the width W of the narrowest part of the first region 10A is, the higher the transmittance of the transparent conductive film 1 is, and the larger the diameter R of the second region 10B is, the higher the transmittance of the transparent conductive film 1 is. Further, it can be also seen from FIG. 5 and FIG. 6 that a condition exists in which the transmittance in the case where both of the width W of the narrowest part of the first region 10A and the diameter R of the second region 10B are large, and the transmittance in the case where both of the width W of the narrowest part of the first region 10A and the diameter R of the second region 10B are small are equal (or substantially equal) to each other.

On the other hand, it can be seen from FIG. 7 and FIG. 8 that the smaller the width W of the narrowest part of the first region 10A is, and the larger the sheet resistance of the transparent conductive film 1 is, and the smaller the diameter R of the second region 10B is, the smaller the sheet resistance of the transparent conductive film 1 is. Further, it can be also seen from FIG. 7 and FIG. 8 that a condition exists in which the sheet resistance in the case where both of the width W of the narrowest part of the first region 10A and the diameter R of the second region 10B are large, and the sheet resistance in the case where both of the width W of the narrowest part of the first region 10A and the diameter R of the second region 10B are small are equal (or substantially equal) to each other.

FIG. 9 illustrates an example of a relationship between a percentage (coverage) of the transparent conductive film 1 covering a base material, and the transmittance and the sheet resistance of the transparent conductive film 1. It is to be noted that, in FIG. 9, a result when the coverage is 100% is of a single-layered graphene sheet that is configured only of the first region 10A and does not include the second region 10B. Further, in FIG. 9, a result when the coverage is 0% is of a case where nothing is present as a member covering the base material. It can be seen from FIG. 9 that the smaller the coverage is, the higher the both of the transmittance and the sheet resistance are. It is to be noted that the transparent conductive film 1 of the present embodiment includes the second region 10B, and thus is configured to have the coverage of 1% to 99% both inclusive, and is not configured to have the coverage of 0 or 100%. Therefore, the transmittance of the transparent conductive film 1 is equal to or higher than the transmittance (97.7%) in the case where the coverage is 100%, and equal to or lower than the transmittance (100.0%) in the case where the coverage is 0%. In addition, the sheet resistance of the transparent conductive film 1 is larger than the sheet resistance (80 ohm/square) in the case where the coverage is 100%, and is smaller than the sheet resistance (infinite) in the case where the coverage is 0%.

Incidentally, transmittance of a high-transmittance PET film with ITO is typically about 91%, and sheet resistance thereof is typically about 200 ohm/square. Actually, it is necessary to consider reflection, absorption, and the like of the base material itself forming the transparent conductive film 1, but, when the coverage of the transparent conductive film 1 is from 1% to 99% both inclusive, the transmittance of the transparent conductive film 1 is higher than the transmittance of the PET film with ITO. Further, when the coverage is from 60% to 99% both inclusive, it is not only that the transmittance of the transparent conductive film 1 is higher than the transmittance of ITO, but also that the sheet resistance of the transparent conductive film 1 is lower than the sheet resistance of ITO.

Further, when a device to which the transparent conductive film 1 is applied is taken into consideration, the width W of the narrowest part of the first region 10A and the diameter R of the second region 10B may be, for example, as follows. In a projection-type capacitance touch panel, an electrode has a comb-type pattern structure, and a line width of a part where the electrode is thin is about 100 micrometers. Therefore, when the transparent conductive film 1 is used as the electrode, the size of the opening (the diameter R of the second region 10B) may be desirably about some tens of micrometers, in order to prevent isolation of the electrode. In addition, since the resistance of the electrode may be desirably about hundreds of ohms, the coverage of the transparent conductive film 1 may be desirably 10% or higher. It is to be noted that, because the resistance of an electrode available on the market is about 200 ohms, the coverage of the transparent conductive film 1 may be desirably 60% or higher in this case.

Further, in a surface capacitance touch panel or a resistive-film-type touch panel, the size of the opening (the diameter R of the second region 10B) does not matter very much, because an electrode does not have a pattern structure. However, even though the transparency of the graphene is high, visibility is affected when the diameter R of the second region 10B is larger than some hundreds of micrometers. Therefore, the diameter R of the second region 10B may be desirably smaller than that. Further, since it is necessary that the resistance value of the electrode be about some hundreds of ohms, the coverage of the electrode may be desirably 10% or higher.

Furthermore, in a solid-state image pickup device or an organic photoelectric transducer, since a pixel size is some micrometers, the size of the opening (the diameter R of the second region 10B) may be desirably about some hundreds of nanometers that is about one-tenth of the pixel size. Further, when the openings (the second regions 10B) are arranged regularly, the openings may be desirably formed at irregular positions or may desirably have irregular shapes, in order to reduce influence of interference and the like. Moreover, the coverage of the electrode may be desirably 80% or lower, because high transmittancy is important.

The thickness of the conductive graphene sheet 10 is equal to the thickness of the graphene, and may be about 0.3 nm, for example. Therefore, the thickness of the conductive graphene sheet 10 is thinner than the thickness (some tens of micrometers) of a metal grid and the thickness (some hundreds of nanometers) of a metal oxide. Further, the conductive graphene sheet 10 is excellent in flatness, and has solvent resistance and acid resistance. Moreover, the conductive graphene sheet 10 has flexibility due to thinness thereof. Further, the conductive graphene sheet 10 is allowed to be formed using CVD, transfer, or the like and does not have damage like that in ITO formed by sputtering.

(Method of Manufacturing)

Next, an example of a method of manufacturing the transparent conductive film 1 will be described.

First, a copper foil 20 is prepared (see Part (A) of FIG. 10). Next, a single-layered graphene sheet 10D is formed on the copper foil 20, by supplying gas such as methane into a chamber, through CVD. For example, the copper foil 20 made of electrolytic copper foil, which is a 10 cm square and 35 micrometers thick, may be placed in a tubular furnace, and hydrogen gas is supplied at 1,000 degrees Celsius for 30 minutes. Next, a gas mixture of methane and hydrogen is supplied for 15 minutes, to form the single-layered graphene sheet 10D on the copper foil 20. Afterwards, the temperature is decreased while the hydrogen gas is supplied again.

The copper foil 20 on which the single-layered graphene sheet 10D is formed is taken out from the furnace, and a resin sheet 30 made of PMMA is deposited on a surface of the graphene sheet 10D (Part (B) of FIG. 10). Next, after the copper foil 20 is removed in an iron nitrate solution of 1M, a glass substrate 40 is affixed onto the graphene sheet 10D (Part (C) of FIG. 10). Afterwards, the resin sheet 30 is removed by acetone or the like (Part (D) of FIG. 10).

Next, a photoresist layer is deposited on the graphene sheet 10D, by spin coating or the like. Thereafter, the photoresist layer is selectively exposed and developed, and then, the graphene sheet 10D may be selectively removed by ashing, for example. Subsequently, the photoresist layer is removed. In this way, the transparent conductive film 1 provided with the conductive graphene sheet 10 is formed on the glass substrate 40.

It is to be noted that the transparent conductive film 1 may be formed by a method other than the method described above.

(First Method)

For example, in the above-described method of manufacturing, after the glass substrate 40 is affixed onto the graphene sheet 10D, a predetermined pattern is formed on the resin sheet 30 by using electron beam lithography, and is developed. Next, the graphene sheet 10D may be selectively removed by ashing, for example. Afterwards, the resin sheet 30 is removed. In this way, the transparent conductive film 1 provided with the conductive graphene sheet 10 is formed on the glass substrate 40.

(Second Method)

For example, in the above-described method of manufacturing, after the resin sheet 30 is removed, a laser-irradiated area of the graphene sheet 10D is selectively removed using laser etching. In this way, the transparent conductive film 1 provided with the conductive graphene sheet 10 is formed on the glass substrate 40. It is to be noted that this technique is suitable for a case in which an irradiation pattern formed by laser etching is relatively large.

(Effects)

Next, effects of the transparent conductive film 1 will be described.

In the present embodiment, in the conductive graphene sheet 10, the second region 10B that has optical transmittance higher than that of the graphene is provided in a mode of being surrounded by the first region 10A made of the graphene. This allows the optical transmittance of the conductive graphene sheet 10 itself to be increased to be higher than optical transmittance of a conductive graphene sheet that does not have a region having high optical transmittance similar to the second region 10B. As a result, the optical transmittance of the light transmission region as a whole is allowed to be higher than the upper limit (97.7%) of the optical transmittance of the single-layered graphene sheet, even when the conductive graphene sheet 10 is provided over the entire light transmission region.

Further, in the present embodiment, the width W of the narrowest part of the first region 10A is larger than 10 nm and thus, the conductive graphene sheet 10 is allowed not to develop the properties of a semiconductor, by optimizing the method of manufacturing. This prevents a decline in conductivity due to development of the properties of a semiconductor in the conductive graphene sheet 10.

2. Modifications (First Modification)

In the above-described embodiment, the case in which the second regions 10B are surrounded by the first region 10A has been provided as an example, but, for example, as illustrated in FIG. 11, part of the second regions 10B may be surrounded by the first region 10A, and the rest of the second regions 10B may be notches formed at an edge part of the first region 10A (that is, an edge part of the conductive graphene sheet 10).

(Second Modification)

In the embodiment and the first modification described above, the transparent conductive film 1 has been configured of the single-layered conductive graphene sheet 10, but the transparent conductive film 1 may be configured by laminating a plurality of single-layered conductive graphene sheets 10. For example, as illustrated in FIG. 12, the transparent conductive film 1 may be configured by laminating two layers of the single-layered conductive graphene sheet 10.

The second regions 10B of the respective conductive graphene sheets 10 may face one another, as illustrated in FIG. 13, for example, or may be laid out not to face one another at least in part, as illustrated in FIG. 14, for example. Further, as illustrated in FIG. 15, for example, the second region 10B of each of the conductive graphene sheets 10 may be laid out to face the first region 10A of other conductive graphene sheet 10.

In the present modification, the transparent conductive film 1 is configured by laminating the plurality of single-layered conductive graphene sheets 10, and therefore, the optical transmittance is allowed to be higher than optical transmittance in a case where a conductive graphene sheet that does not have the second region 10B is laminated. This may make it possible to, for example, ease a decline in the optical transmittance, while reducing the sheet resistance to be smaller than 80 ohm/square, when the plurality of single-layered conductive graphene sheets 10 are laminated.

Moreover, in the present modification, when the second regions 10B of the respective conductive graphene sheets 10 are laid out to face each other as illustrated in FIG. 13, for example, a region where the optical transmittance of the transparent conductive film 1 is extremely high is allowed to be formed more widely.

Further, in the present modification, when the second regions 10B of the respective conductive graphene sheets 10 are laid out not to face one another, as illustrated in FIG. 14, for example, a region where the first regions 10A of the respective conductive graphene sheets 10 face one another is allowed to be reduced. As a result, a region where the optical transmittance of the transparent conductive film 1 significantly declines is allowed to be reduced. In addition, in-plane luminance is allowed to be more uniform than that in the case of FIG. 13.

Furthermore, in the present modification, when the second regions 10B of the respective conductive graphene sheets 10 are laid out not to overlap each other as illustrated in FIG. 15, for example, a region where the first regions 10A of the respective conductive graphene sheets 10 face one another is allowed to be reduced further. As a result, a region where the optical transmittance of the transparent conductive film 1 significantly declines is allowed to be reduced further. In addition, in-plane luminance is allowed to be more uniform than that in the case of FIG. 14.

(Third Modification)

In the embodiment, the first modification, and the second modification described above, the first region 10A is configured of the conductive graphene, but the first region 10A may include a modified region which is doped with the conductive graphene. The doping of the conductive graphene may be performed, for example, by causing a doping solution to contact a surface of the conductive graphene. The doping solution may be, for example, a solution in which a gold chloride is dissolved in nitromethane, and, for example, a density of the gold chloride contained in the nitromethane may be 0.02 M.

For example, after the above-described doping solution is dropped on the conductive graphene sheet 10 of the transparent conductive film 1, spin coating may be performed under conditions of 2000 rpm and 40 seconds, for example. Afterwards, the doping solution on the conductive graphene sheet 10 is naturally dried. As a result, the gold chloride that is a dopant adheres to the graphene of the conductive graphene sheet 10, and the conductive graphene sheet 10 having the coverage of 100% and the sheet resistance of 80 ohm/square is formed.

In this conductive graphene sheet 10, for example, when the second region 10B is formed so that the coverage is 50%, the sheet resistance of the conductive graphene sheet 10 is 274 ohm/square. As described above, as the coverage decreases, the sheet resistance of the conductive graphene sheet 10 increases proportionally. However, when the diameter R of the second region 10B is equal to or smaller than some tens of micrometers, edges of the graphene in the graphene sheet 10D increase, and doped spots increase, as compared with the case in which the diameter R of the second region 10B is larger than some tens of micrometers. Therefore, when the diameter R of the second region 10B is equal to or smaller than some tens of micrometers, the sheet resistance of the conductive graphene sheet 10 is smaller than 274 ohm/square even when the coverage is 50%. Hence, when it is desired to obtain the conductive graphene sheet 10 having smaller sheet resistance, doping the conductive graphene sheet 10 in which the diameter R of the second region 10B is small may be preferable, in particular.

Incidentally, as a ligand selectively binding to the edge of the graphene, a ligand described in Nano Lett. 2010, 10, 398-405 and the like is known, for example. Ligands may be allowed to selectively bind to the edge of the graphene, also by using the technique described in this document. For example, the produced conductive graphene sheet 10 is immersed in a solution in which SDS is added to be 1 wt % to a 4-nitrobenzene diazonium tetrafluoroborate water solution of 25 mM, and the conductive graphene sheet 10 is then taken out and washed after being caused to react at 35 degrees Celsius for seven hours. This allows ligands described below to be selectively introduced to the edge of the graphene, as illustrated in FIG. 16.

(Fourth Modification)

In the embodiment and the first modification to the third modification described above, the second region 10B has been configured of the cavity. However, for example, in the transparent conductive film 1 exemplified in Part (B) of FIG. 1 and FIG. 12 to FIG. 15, the second region 10B may be configured of (e.g. filled with) some kind of light transmissive material (for example, Parts (A) to (E) of FIG. 17).

It is to be noted that Part (A) of FIG. 17 is a cross-sectional diagram of an example in which the second region 10B is configured of some kind of light transmissive material, in the transparent conductive film 1 of Part (B) of FIG. 1. Part (B) of FIG. 17 is a cross-sectional diagram of an example in which the second region 10B is configured of some kind of light transmissive material, in the transparent conductive film 1 of FIG. 11. Part (C) of FIG. 17 is a cross-sectional diagram of an example in which the second region 10B is configured of some kind of light transmissive material, in the transparent conductive film 1 of FIG. 13. Part (D) of FIG. 17 is a cross-sectional diagram of an example in which the second region 10B is configured of some kind of light transmissive material, in the transparent conductive film 1 of FIG. 14. Part (E) of FIG. 17 is a cross-sectional diagram of an example in which the second region 10B is configured of some kind of light transmissive material, in the transparent conductive film 1 of FIG. 15.

Here, the second region 10B may be preferably configured of a material having optical transmittance higher than the optical transmittance of a single layer of graphene, and may be, preferably, for example, filled with at least one kind among graphene oxide, transparent polymer material, and inorganic material. For example, polyethylene, polypropylene, polyethylene terephthalate, polystyrene, ABS resin, acrylic, polyamide, polycarbonate, Teflon (registered trademark), phynol resin, melamine, urethane, epoxy, or the like may be named as the above-described transparent polymer material. Further, examples of the above-described inorganic material include $SiO_2$, $NbO_2$, and the like.

In the present modification, the conductive graphene sheet 10 may be, for example, a flat sheet in which the graphene and some kind of light transmissive material are entirely spread, and which has no opening or no notch.

It is to be noted that the material filling the second region 10B may protrude beyond the surface (a graphene surface) of the first region 10A. Further, the same material as the material filling the second region 10B may overlap the whole or a part of the surface of the first region 10A. For example, after the openings are provided in the graphene, the openings are filled with a resin to be in a state in which a surface is hemispheric and slightly protrudes onto the first region 10A, and the resin is cured in that state. Thus, the second region 10B in a convex shape or the second region 10B protruding onto the surface of the first region 10A may be provided.

Here, when the second region 10B is configured of the material having the optical transmittance higher than the optical transmittance of a single layer of graphene as described above, the optical transmittance of the second region 10B is higher than the optical transmittance of the first region 10A. Therefore, the optical transmittance of the entire conductive graphene sheet 10 is also higher than the optical transmittance of the single layer of graphene. Hence, in the present modification, as with the above-described embodiment, the optical transmittance of the conductive graphene sheet 10 is allowed to be higher than 97.7%.

(Fifth Modification)

In the embodiment and the first modification to the fourth modification described above, the transparent conductive film 1 is configured of the one or the plurality of conductive graphene sheets 10. However, those transparent conductive films 1 may further include a single-layered conductive graphene sheet 50 made of graphene, and having no opening (that is, having no second region 10B). For example, the transparent conductive film 1 like those illustrated in Part (B) of FIG. 1 and FIG. 12 to FIG. 15 may further include the conductive graphene sheet 50 (e.g. Parts (A) to (E) of FIG. 18). Moreover, for example, the transparent conductive film 1 like those illustrated in Parts (A) to (E) of FIG. 17 may further include the conductive graphene sheet 50 (e.g. Parts (A) to (E) of FIG. 19).

It is to be noted that Part (A) of FIG. 18 is a cross-sectional diagram of a case where the transparent conductive film 1 of Part (B) of FIG. 1 is further provided with the conductive graphene sheet 50. Part (B) of FIG. 18 is a cross-sectional diagram of a case where the transparent conductive film 1 of FIG. 11 is further provided with the conductive graphene sheet 50. Part (C) of FIG. 18 is a cross-sectional diagram of a case where the transparent conductive film 1 of FIG. 13 is further provided with the conductive graphene sheet 50. Part (D) of FIG. 18 is a cross-sectional diagram of a case where the transparent conductive film 1 of FIG. 14 is further provided with the conductive graphene sheet 50. Part (E) of FIG. 18 is a cross-sectional diagram of a case where the transparent conductive film 1 of FIG. 15 is further provided with the conductive graphene sheet 50.

In addition, Part (A) of FIG. 19 is a cross-sectional diagram of a case where the transparent conductive film 1 of Part (A) of FIG. 17 is further provided with the conductive graphene sheet 50. Part (B) of FIG. 19 is a cross-sectional diagram of a case where the transparent conductive film 1 of Part (B) of FIG. 17 is further provided with the conductive graphene sheet 50. Part (C) of FIG. 19 is a cross-sectional diagram of a case where the transparent conductive film 1 of Part (C) of FIG. 17 is further provided with the conductive graphene sheet 50. Part (D) of FIG. 19 is a cross-sectional diagram of a case where the transparent conductive film 1 of Part (D) of FIG. 17 is further provided with the conductive graphene sheet 50. Part (E) of FIG. 19 is a cross-sectional diagram of a case where the transparent conductive film 1 of Part (E) of FIG. 17 is further provided with the conductive graphene sheet 50.

It is to be noted that, in the present modification, the transparent conductive film 1 may include a plurality of conductive graphene sheets 50.

3. Example

Next, Example of the present technology will be described. A basic method of manufacturing a transparent conductive film according to Example is the same as the method of the embodiment described above (see Parts (A) to (D) of FIG. 10). It is to be noted that, in the present Example, a quartz substrate was used in place of the glass substrate 40, hydrogen annealing of 400 degrees Celsius was used for the removal of the resin sheet 30 made of the PMMA in place of acetone or the like, and oxygen RIE (Reactive Ion Etching) was used for the selective removal of the graphene sheet 10D in place of ashing.

FIG. 20 illustrates results of measuring wavelength dependence of the transmittance of the graphene sheet 10D formed in the process of manufacturing the transparent conductive film according to Example. As illustrated in FIG. 20, transmittance of 96.3% was obtained at a wavelength of 550 nm. The transmittance was a value slightly lower than normal transmittance (97.7%) of graphene.

Parts (A) to (D) of FIG. 21 are photographs of appearances of transparent conductive films according to Example. Part (A) of FIG. 21 is the photograph of the appearance of the transparent conductive film having an opening ratio of 25%, and Part (B) of FIG. 21 is the photograph of the appearance of the transparent conductive film having an opening ratio of 50%. Part (C) of FIG. 21 is the photograph of the appearance of the transparent conductive film having an opening ratio of 75%, and Part (D) of FIG. 21 is the photograph of the appearance of the transparent conductive film having an opening ratio of 87.5%. FIG. 22 illustrates an actual measurement value of the transmittance of the transparent conductive film in each of Parts (A) to (D) of FIG. 21. It is to be noted that, in the transparent conductive film in each of Parts (A) to (D) of FIG. 21, the width W of the narrowest part of the first region 10A was assumed to be uniform (8 micrometers). From FIG. 22, it was found that the transmittance increased, in proportion to the increase of the opening ratio.

FIG. 23 illustrates a measured value of the wavelength dependence of the transmittance in the transparent conductive film in each of FIG. 20 and Parts (A) to (D) of FIG. 21. It was found from FIG. 23 that the transparent conductive film in each of Parts (A) to (D) of FIG. 21 had the transmittance of 96.3% or higher at a wavelength of 550 nm, and the transmittance increased with increase in the opening ratio. FIG. 24 illustrates a calculated value and an actual measurement value of the sheet resistance of the transparent conductive film in each of FIG. 20 and Parts (A) to (D) of FIG. 21. The calculated value of the sheet resistance was obtained using a calculation formula of $(2R+W) \times R0/((R+W) \times (1-p))$. It is to be noted that R0 is an actual measurement value of the sheet resistance of the transparent conductive film in FIG. 20. p is an opening ratio. From FIG. 24, it was found that the sheet resistance increased with increase in the opening ratio. This was because a cross-sectional area of the transparent conductive film (a cross-sectional area of a current path) decreased as the opening ratio increased. Further, from FIG. 24, it was found that deviation of the actual measurement value from the calculated value increased with increase in the opening ratio.

FIG. 25 illustrates a calculated value and an actual value in the sheet resistance of the transparent conductive film in each of FIG. 20 and Parts (A) to (D) of FIG. 21, before doping and after the doping. The doping was performed by the same method as the method described above in the third modification, but the density of a gold chloride was 0.005M. From FIG. 25, it was found that the sheet resistance after the doping was smaller than that before the doping (a case in which the doping was not performed). Further, from FIG. 25, it was found that deviation of the actual value from the calculated value after the doping was smaller than that before the doping. FIG. 26 illustrates a calculated value and an actual value in the sheet resistance of the transparent conductive film in each of FIG. 20 and Parts (A) to (D) of FIG. 21, before the doping and after the doping. From FIG. 26, it was found that the transmittance slightly was lowered by the doping.

Parts (A) to (D) of FIG. 27 are each a photograph of an appearance of each transparent conductive film when the width W of the narrowest part of the first region 10A is each of 2 micrometers, 4 micrometers, 8 micrometers, and 16 micrometers, while the opening ratio is constant (75%). Part (A) of FIG. 27 is the photograph of the appearance of the transparent conductive film having the width W of 2 micrometers, and Part (B) of FIG. 27 is the photograph of the appearance of the transparent conductive film having the width W of 4 micrometers. Part (C) of FIG. 27 is the photograph of the appearance of the transparent conductive film having the width W of 8 micrometers, and Part (D) of FIG. 27 is the photograph of the appearance of the transparent conductive film having the width W of 16 micrometers. FIG. 28 illustrates a calculated value and an actual measurement value in sheet resistance of the transparent conductive film in each of Parts (A) to (D) of FIG. 27, before doping and after the doping. It was found from FIG. 28 that deviation (an amount of a decline) of the sheet resistance from the calculated value increased as the width W was reduced. FIG. 29 illustrates an actual measurement value in carrier density of the transparent conductive film in each of Parts (A) to (D) of FIG. 27, before the doping and after the doping. It was found from FIG. 29 that the carrier density increased as the width W was reduced. In FIG. 29, the opening ratio is constant and thus, FIG. 29 implies that the doping amount tends to increase at the edge of graphene.

Incidentally, when the opening ratio is constant, the cross-sectional area (the cross-sectional area of the current path) of the transparent conductive film is also constant and thus, it is usual to think that the sheet resistance does not depend on the width W. Judging from this common knowledge, the actual measurement value of FIG. 28 appears to be unusual. However, even when the opening ratio is constant, an edge length of the graphene per unit area increases with decrease in the width W. Here, as implied in FIG. 29, the doping amount tends to increase at the edge of the graphene and thus, it is inferred that the doping amount per unit area increases as the edge length of the graphene per unit area becomes longer. Hence, when the width W is decreased while the opening ratio is constant, the sheet resistance also decreases, and thus, it may be said that a tendency of the actual measurement value in FIG. 28 is quite reasonable.

FIG. 30 illustrates a value (relative sheet resistance) obtained by normalizing an actual measurement value of the sheet resistance with a predetermined value, when the width W is varied. It was found from FIG. 30 that the value of the relative sheet resistance was saturated when the width W was equal to or larger than 30 micrometers. Further, it was found that when the width W was 0.015 micrometers (15 nm), the value of the relative sheet resistance was equal to the above-mentioned saturation value. Furthermore, it was found that, when the width W was 0.03 micrometers (30 nm), the value of the relative sheet resistance was at the minimum. Based upon the foregoing, the width W may be preferably larger than 0.01 micrometers (10 nm), considering the conductivity of the graphene, and may be preferably 0.015 micrometers (15 nm) or larger, considering that the value of the relative sheet resistance becomes the saturation value or smaller. However, the width W may be preferably 0.03 micrometers (30 nm) or larger, considering variations due to manufacturing errors. In terms of the value of the relative sheet resistance being a minimum value, the width W may be preferably 0.03 micrometers (30 nm). The width W may be preferably larger than 10 nm and equal to or smaller than 30 micrometers. In terms of the value of the relative sheet resistance becoming the saturation value or smaller, the width W may be preferably 0.015 micrometers (15 nm) or larger and 30 micrometers or smaller. Further, considering the variations due to manufacturing errors, the width W may be, more preferably, 0.03 micrometers (30 nm) or larger and 30 micrometers or smaller.

4. Application Examples

Next, application examples of the transparent conductive film 1 according to the embodiment and the modifications described above will be described. Various electronic apparatuses provided with the transparent conductive film 1 as an electrode will be described as the application examples of the transparent conductive film 1.

(First Application Example)

FIG. 31 is a developed perspective view of a transparent heater 100 according to a first application example. The transparent heater 100 includes the transparent conductive film 1 as an electrode for heat generation. The transparent heater 100 includes an electrode 120 and the transparent conductive film 1 electrically connected to the electrode 120, between a transparent base material 110 and a transparent base material 130. The transparent base material 110 and the transparent base material 130 may be made of, for example, a glass substrate.

In the transparent heater 100, by a flow of a current from the electrode 120 to the transparent conductive film 1, the transparent conductive film 1 generates heat, and the heat is radiated from the transparent conductive film 1. The transparent heater 100 thereby functions as a heater. Here, the transparent base material 110, the transparent conductive film 1, and the transparent base material 130 are all configured of the respective optical transparent members and therefore, for example, it may be possible to install the transparent heater 100 on an image display surface of a liquid crystal display. In that case, it is possible to keep the liquid crystal display warm without disturbing image display and thus, for example, it may be possible to increase an operating temperature range in a case where the liquid crystal display is used in a cold district.

(Second Application Example)

FIG. 32 is a cross-sectional diagram of a touch panel 200 according to a second application example. The touch panel 200 is of a resistive-film type, and detects a position pressed by a finger, a pen, or the like on a screen, by measuring a voltage variation. The touch panel 200 includes a plurality of transparent conductive films 1 as a detection electrode. The touch panel 200 may be, for example, a panel in which a transparent base material 210 having a surface where a plurality of transparent conductive films 1 are formed and a flexible transparent base material 230 having a surface where a plurality of transparent conductive films 1 are formed are disposed so that the respective transparent conductive films 1 thereof face each other. Each of the transparent conductive films 1 on the transparent base material 210 side and each of the transparent conductive films 1 on the flexible base material 230 side is stripe-shaped, and the transparent conductive films 1 on the transparent base material 210 side and the transparent conductive films 1 on the flexible base material 230 side extend in directions orthogonal to each other. The touch panel 200 further includes an annular insulation frame 220 and a plurality of dot spacers 240 between the transparent conductive films 1 on the transparent base material 210 side and the transparent conductive films 1 on the flexible base material 230 side. The annular insulation frame 220 forms a predetermined gap and insulates the transparent conductive films 1 from each other. The dot spacers 240 prevents the transparent conductive films 1 from touching each other when the flexible base material 230 is not pressed by a finger, a pen, or the like.

In the touch panel 200, the transparent conductive film 1 on the flexible base material 230 side is curved when the flexible base material 230 is pressed down by a finger, a pen, or the like, and therefore, the curved part and the transparent conductive film 1 on the transparent base material 210 side touch each other. Accordingly, a current flows through the transparent conductive film 1. This causes variation corresponding to a contact location in an output voltage of the touch panel 200. Therefore, a position touched by a finger, a pen, or the like is allowed to be detected based on the voltage variation. Here, the transparent base material 210, the transparent conductive film 1, and the flexible base material 230 are each configured of a transparent member. Therefore, for example, the touch panel 200 may be installed on an image display surface of a display, and the touch panel 200 may be used as an input device. For example, in a case where an icon associated with a specific function is displayed on the image display surface, when touching by a finger, a pen, or the like at a position corresponding to the icon is detected based on a signal inputted from the touch panel 200, the display may execute the function associated with the icon.

(Third Application Example)

Part (A) of FIG. 33 is a cross-sectional diagram of a touch panel 300 according to a third application example. The touch panel 300 is of a surface-capacitance type, and detects a position touched by a finger on a screen, based on a variation in capacitance. The touch panel 300 includes the transparent conductive film 1 as a detection electrode. The touch panel 300 may be, for example, a panel in which a transparent base material 310 having a surface where the transparent conductive film 1 is formed and a protective film 320 protecting the transparent conductive film 1 are disposed so that the transparent conductive film 1 and the protective film 320 face each other. The touch panel 300 further includes an electrode 330 electrically connected to the transparent conductive film 1, at each of four corners of the transparent conductive film 1, as illustrated in Part (B) of FIG. 33.

In the touch panel 300, a voltage is applied to the electrode 330 at each of the four corners of the transparent conductive film 1, and a uniform electric field is thereby generated in the entire panel. Therefore, when a finger touches the surface, capacitance of the touch panel 300 is varied, and a voltage corresponding to the variation in capacitance is outputted to the four electrodes 330 of the touch panel 300 and thus, a position touched by the finger is allowed to be detected based on that voltage variation. Here, the transparent base material 310, the transparent conductive film 1, and the protective film 320 are each configured of a transparent member, and therefore, for example, the touch panel 300 may be installed on an image display surface of a display, and the touch panel 300 may be used as an input device.

(Fourth Application Example)

Part (A) of FIG. 34 is a cross-sectional diagram of a touch panel 400 according to a fourth application example. The touch panel 400 is of a projection-capacitance type, and detects a variation in electric field based on a variation in capacitance when a finger is brought close to a surface. The touch panel 400 includes a plurality of transparent conductive films 1 as a detection electrode. The touch panel 400 may be, for example, a panel in which a transparent base material 410 having a surface where a plurality of transparent conductive films 1 are formed and a protective film 430 having a surface where a plurality of transparent conductive films 1 are formed are disposed so that the respective transparent conductive films 1 thereof face each other. The touch panel 400 further includes a transparent insulating layer 420 insulating the respective transparent conductive films 1 from each other, between the transparent conductive film 1 on the transparent base material 410 side and the transparent conductive film 1 on the protective film 430 side. As illustrated in Part (B) of FIG. 34, each of the transparent conductive films 1 on the transparent base material 410 side and each of the transparent conductive films 1 on the protective film 430 side is stripe-shaped, the transparent conductive film 1 on the transparent base material 410 side and the transparent conductive film 1 on the protective film 430 side extend in respective directions intersecting each other.

In the touch panel 400, a voltage is applied to the transparent conductive film 1, and a uniform electric field is thereby generated in the entire panel. Thus, a variation in the electric field when the finger is brought close to the surface appears as a variation in capacitance, and a voltage corresponding to the variation in capacitance is outputted to the transparent conductive film 1, and therefore, a position touched by the finger is allowed to be detected based on that voltage variation. Here, the transparent base material 410, the transparent conductive film 1, the insulating layer 420, and the protective film 430 are each made of a transparent member, and therefore, for example, the touch panel 400 may be installed on an image display surface of a display, and the touch panel 400 may be used as an input device.

(Fifth Application Example)

FIG. 35 is a cross-sectional diagram of a solar battery 500 according to a fifth application example. The solar battery 500 includes the transparent conductive film 1 as an electrode. The solar battery 500 may include, for example, a compound semiconductor or the like using CIGS (Copper, Indium, Gallium, and Selenium) as raw materials, as a photoelectric conversion layer 530. It is to be noted that the photoelectric conversion layer 530 is not limited to the above-described configuration, and may be configured of an electrolytic solution including an iodine redox couple and a dye-adsorbed titanium oxide. The solar battery 500 may have, for example, a structure in which the photoelectric conversion layer 530 is interposed between a base material 510 having a surface on which an electrode 520 is formed and a protective film 540 having a surface on which the transparent conductive film 1 is formed. The solar battery 500 may be, for example, a battery in which the base material 510 and the protective film 540 are disposed so that the electrode 520 and the transparent conductive film 1 face each other.

In the solar battery 500, a current is generated in the photoelectric conversion layer 530, during irradiation of light. This makes it possible to convert the light into electricity.

(Sixth Application Example)

FIG. 36 is a cross-sectional diagram of an organic EL device 600 according to a sixth application example. The organic EL device 600 includes the transparent conductive film 1 as an electrode. The organic EL device 600 may be, for example, a device in which an organic layer 620 is caused to emit light by a current injected into the organic layer 620, and the light emitted from the organic layer 620 is utilized for image display and illumination light. The organic EL device 600 may have, for example, a structure in which the organic layer 620 is interposed between a base material 610 having a surface on which the transparent conductive film 1 is formed and a base material 640 having a surface on which a metal electrode 630 configured of Mg/Al or the like is formed. The organic EL device 600 may be, for example, a device in which the transparent conductive film 1 on the base material 610 side and the metal electrode 630 on the base material 640 side are disposed to face each other. The organic layer 620 may include, for example, a light emitting layer emitting light by electron-hole recombination, a hole transport layer increasing efficiency of hole transport to the light emitting layer, and an electron transport layer increasing efficiency of electron transport to the light emitting layer.

In the organic EL device 600, the light emitting layer emits the light having luminance corresponding to the amount of a current injected into the organic layer 620. This allows the light emitted from the light emitting layer to be utilized for image display, illumination light, and the like.

(Seventh Application Example)

FIG. 37 is a cross-sectional diagram of a liquid crystal device 700 according to a seventh application example. The liquid crystal device 700 includes the transparent conductive film 1 as an electrode. The liquid crystal device 700 includes a liquid crystal panel 710, and a backlight 720 illuminating the liquid crystal panel 710 from a back face. The liquid crystal panel 710 may be, for example, a panel in which light incident on a liquid crystal layer 750 is modulated by application of a voltage to the liquid crystal layer 750, and the light modulated in the liquid crystal layer 750 is utilized for image display, illumination light, and the like. The liquid crystal panel 710 may have, for example, a structure in which the liquid crystal layer 750 is interposed between a base material 740 having a surface on which a plurality of transparent conductive films 1 are formed and a base material 760 in which the transparent conductive film 1 is formed over the entire surface thereof. Each of the transparent conductive films 1 on the base material 740 side forms a pixel electrode. The liquid crystal panel 710 is a panel in which the base material 740 and the base material 760 are disposed so that the respective transparent conductive films 1 face each other. The liquid crystal panel 710 further includes a polarizing plate 730 outside the base material 740, and a polarizing plate 770 outside the base material 760.

In the liquid crystal device 700, light from the backlight 720 is modulated according to the voltage applied to the liquid crystal layer 750. This allows the light modulated in the liquid crystal layer 750 to be utilized for image display, illumination light, and the like.

(Eighth Application Example)

FIG. 38 is a cross-sectional diagram of an electronic paper 800 according to an eighth application example. The electronic paper 800 includes the transparent conductive film 1 as an electrode. The electronic paper 800 includes a TFT substrate 810 having a plurality of TFTs connected to a pixel electrode (not illustrated), a base material 830 having the transparent conductive film 1 on the entire surface on the TFT substrate 810 side, and an electrophoretic layer 820 disposed between the TFT substrate 810 and the transparent conductive film 1. The electrophoretic layer 820 may have, for example, a configuration in which microcapsules containing white and black particles are disposed inside a plane. The white particles are positively charged, and the black particles are negatively charged. Therefore, the electrophoretic layer 820 is capable of switching the particles to be attracted to the surface, by application of a positive voltage or a negative voltage to the pixel electrode. The electrophoretic layer 820 is not limited to the above-described configuration, and may be configured, for example, to have a partition wall partitioning the inside of the plane into a plurality of rooms each containing white and black particles.

In the electronic paper 800, the positions of the white particles and the black particles vary according to the voltage applied to the electrophoretic layer 820. Thus, external light entering the electrophoretic layer 820 is reflected by the white particles, or absorbed by the black particles, to perform image display.

Although the present technology has been described above with reference to the embodiment, the modifications thereof, the Example thereof, as well as the application examples thereof, the present technology may adopt, for example, the following configurations.

(1)

A transparent conductive film including:

a single-layered first conductive graphene sheet including a first region and a second region, the first region being configured of graphene, and the second region being surrounded by the first region and having optical transmittance that is higher than optical transmittance of the first region. (2)

The transparent conductive film according to (1), wherein the second region is configured of one or more of cavity, graphene oxide, transparent polymer material, and inorganic material.

(3)

The transparent conductive film according to (1) or (2), wherein the second region is configured of the cavity, and the cavity is configured of one or both of an opening and a notch.

(4)

The transparent conductive film according to any one of (1) to (3), wherein the first region includes a region modified by doping.

(5)

The transparent conductive film according to any one of (1) to (4), wherein a width of a narrowest part of the first region is larger than 10 nanometers.

(6)

The transparent conductive film according to any one of (1) to (4), wherein a width of a narrowest part of the first region is 15 nanometers or larger.

(7)

The transparent conductive film according to any one of (1) to (4), wherein a width of a narrowest part of the first region is 30 nanometers or larger.

(8)

The transparent conductive film according to any one of (5) to (7), wherein a layout of the second region has regularity in a region expressed by a unit in square micrometer order.

(9)

The transparent conductive film according to any one of (1) to (8), wherein optical transmittance of the first conductive graphene sheet is 97.7 percent or higher.

(10)

The transparent conductive film according to any one of (1) to (9), including a plurality of the first conductive graphene sheets.

(11)

The transparent conductive film according to (10), wherein the second regions in the respective first conductive graphene sheets are laid out not to face one another.

(12)

The transparent conductive film according to (10), wherein the second regions in the respective first conductive graphene sheets face one another.

(13)

The transparent conductive film according to any one of (1) to (12), further including a single-layered second conductive graphene sheet being configured of graphene and having no opening.

(14)

A heater with a transparent conductive film serving as an electrode provided for heat generation, the transparent conductive film including:

a single-layered first conductive graphene sheet including a first region and a second region, the first region being configured of graphene, and the second region being surrounded by the first region and having optical transmittance that is higher than optical transmittance of the first region.

(15)

A touch panel with a transparent conductive film serving as an electrode, the transparent conductive film including:

a single-layered first conductive graphene sheet including a first region and a second region, the first region being configured of graphene, and the second region being surrounded by the first region and having optical transmittance that is higher than optical transmittance of the first region.

(16)

A solar battery with a transparent conductive film serving as an electrode, the transparent conductive film including:

a single-layered first conductive graphene sheet including a first region and a second region, the first region being configured of graphene, and the second region being surrounded by the first region and having optical transmittance that is higher than optical transmittance of the first region.

(17)

An organic electroluminescence device with a transparent conductive film serving as an electrode, the transparent conductive film including:

a single-layered first conductive graphene sheet including a first region and a second region, the first region being configured of graphene, and the second region being surrounded by the first region and having optical transmittance that is higher than optical transmittance of the first region.

(18)

A liquid crystal device with a transparent conductive film serving as an electrode, the transparent conductive film including:

a single-layered first conductive graphene sheet including a first region and a second region, the first region being configured of graphene, and the second region being surrounded by the first region and having optical transmittance that is higher than optical transmittance of the first region.

(19)

An electronic paper with a transparent conductive film serving as an electrode, the transparent conductive film including:

a single-layered first conductive graphene sheet including a first region and a second region, the first region being configured of graphene, and the second region being surrounded by the first region and having optical transmittance that is higher than optical transmittance of the first region.

The present application claims priority based on Japanese Patent Application No. 2011-070355 filed in the Japan Patent Office on Mar. 28, 2011 and Japanese Patent Application No. 2012-009460 filed in the Japan Patent Office on Jan. 19, 2012, the entire contents of each of which is hereby incorporated by reference.

The invention claimed is:

1. A transparent conductive film, comprising:

a single-layered first conductive graphene sheet including a first region and a second region, wherein the first region is configured of graphene, and the second region is surrounded by the first region, wherein the second region is configured of a light transmissive material, and wherein a first optical transmittance of the second region is higher than a second optical transmittance of the first region.

2. The transparent conductive film according to claim 1, wherein the light transmissive material comprises at least one of graphene oxide, transparent polymer material, or inorganic material.

3. The transparent conductive film according to claim 1, wherein the first region includes a region modified based on doping.

4. The transparent conductive film according to claim 1, wherein a width of a narrowest part of the first region is larger than 10 nanometers.

5. The transparent conductive film according to claim 1, wherein a width of a narrowest part of the first region is 15 nanometers or larger.

6. The transparent conductive film according to claim 1, wherein a width of a narrowest part of the first region is 30 nanometers or larger.

7. The transparent conductive film according to claim 1, wherein a layout of the second region has regularity in a region expressed by a unit in square micrometer order.

8. The transparent conductive film according to claim 1, wherein a third optical transmittance of the single-layered first conductive graphene sheet is 97.7 percent or higher.

9. The transparent conductive film according to claim 1, further comprising a plurality of the single-layered first conductive graphene sheets.

10. The transparent conductive film according to claim 9, wherein the second regions in the respective plurality of the single-layered first conductive graphene sheets are laid out not to face one another.

11. The transparent conductive film according to claim 9, wherein the second regions in the respective plurality of the first conductive graphene sheets face one another.

12. The transparent conductive film according to claim 1, further comprising a single-layered second conductive graphene sheet, wherein the single-layered second conductive graphene sheet is configured of graphene and have no opening.

13. A heater, comprising:
a transparent conductive film configured to serve as an electrode provided for heat generation, the transparent conductive film comprising:
a single-layered first conductive graphene sheet including a first region and a second region,
wherein the first region is configured of graphene, and the second region is surrounded by the first region,
wherein the second region is configured of a light transmissive material, and
wherein a first optical transmittance of the second region is higher than a second optical transmittance of the first region.

14. A touch panel, comprising:
a transparent conductive film configured to serve as an electrode, the transparent conductive film comprising:
a single-layered first conductive graphene sheet including a first region and a second region,
wherein the first region is configured of graphene, and the second region is surrounded by the first region,
wherein the second region is configured of a light transmissive material, and
wherein a first optical transmittance of the second region is higher than a second optical transmittance of the first region.

15. A solar battery comprising:
a transparent conductive film configured to serve as an electrode, the transparent conductive film comprising:
a single-layered first conductive graphene sheet including a first region and a second region,
wherein the first region is configured of graphene, and the second region is surrounded by the first region,
wherein the second region is configured of a light transmissive material, and
wherein a first optical transmittance of the second region is higher than a second optical transmittance of the first region.

16. An organic electroluminescence device comprising:
a transparent conductive film configured to serve as an electrode, the transparent conductive film comprising:
a single-layered first conductive graphene sheet including a first region and a second region,
wherein the first region is configured of graphene, and the second region is surrounded by the first region,
wherein the second region is configured of a light transmissive material, and
wherein a first optical transmittance of the second region is higher than a second optical transmittance of the first region.

17. A liquid crystal device comprising:
a transparent conductive film configured to serve as an electrode, the transparent conductive film comprising:
a single-layered first conductive graphene sheet including a first region and a second region,
wherein the first region is configured of graphene, and the second region is surrounded by the first region,
wherein the second region is configured of a light transmissive material, and
wherein a first optical transmittance of the second region is higher than a second optical transmittance of the first region.

18. An electronic paper comprising:
a transparent conductive film configured to serve as an electrode, the transparent conductive film comprising:
a single-layered first conductive graphene sheet including a first region and a second region,
wherein the first region is configured of graphene, and the second region is surrounded by the first region,
wherein the second region is configured of a light transmissive material, and
wherein a first optical transmittance of the second region is higher than a second optical transmittance of the first region.

* * * * *